(12) United States Patent  
Arduini

(10) Patent No.: US 12,575,054 B2  
(45) Date of Patent: Mar. 10, 2026

(54) AIR COOLING, LATENT HEAT COOLING, AND POWER SUPPLY COOLING

(71) Applicant: Cisco Technology, Inc., San Jose, CA (US)

(72) Inventor: Douglas Paul Arduini, Florence, OR (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 307 days.

(21) Appl. No.: 18/301,655

(22) Filed: Apr. 17, 2023

(65) Prior Publication Data

US 2023/0354548 A1 Nov. 2, 2023

Related U.S. Application Data

(60) Provisional application No. 63/336,352, filed on Apr. 29, 2022.

(51) Int. Cl.  
H05K 7/20 (2006.01)

(52) U.S. Cl.  
CPC ..... H05K 7/20154 (2013.01); H05K 7/20209 (2013.01); H05K 7/20327 (2013.01); H05K 7/20409 (2013.01)

(58) Field of Classification Search  
CPC ........... H05K 7/20263; H05K 7/20272; H05K 7/20318; H05K 7/20409; G03B 21/16; F28D 15/00  
USPC ........................................................ 361/688  
See application file for complete search history.

(56) References Cited

U.S. PATENT DOCUMENTS

| | | | |
|---|---|---|---|
| 9,854,714 B2 | 12/2017 | Shedd | |
| 9,901,013 B2 | 2/2018 | Shedd et al. | |
| 10,404,097 B2 | 9/2019 | Arduini et al. | |
| 2006/0117782 A1* | 6/2006 | Rini | F25B 19/02 |
| | | | 62/304 |
| 2006/0137860 A1* | 6/2006 | Prasher | H01L 23/473 |
| | | | 257/E23.098 |
| 2010/0128436 A1 | 5/2010 | Edmunds | |
| 2013/0138253 A1* | 5/2013 | Chainer | H05K 7/20781 |
| | | | 700/282 |
| 2015/0241094 A1* | 8/2015 | Blomberg | F28F 7/02 |
| | | | 62/515 |
| 2015/0257303 A1 | 9/2015 | Shedd | |
| 2016/0120019 A1 | 4/2016 | Shedd et al. | |
| 2017/0332514 A1* | 11/2017 | Saito | F28D 15/0275 |

(Continued)

FOREIGN PATENT DOCUMENTS

WO 2016069271 A1 5/2016

OTHER PUBLICATIONS

Williams, B. "High Performance Cooling for Power Electronics," Power Electronics, Chapter 6, retrieved from the Internet on Feb. 4, 2023, 70 pages.

*Primary Examiner* — Mandeep S Buttar  
*Assistant Examiner* — Kyle Oxenknecht  
(74) *Attorney, Agent, or Firm* — Edell, Shapiro & Finnan, LLC

(57) ABSTRACT

Presented herein are techniques to improve air cooling for higher power and power density power supply examples, including using latent heat of vaporization as a single-phase liquid-cooling-to-air closed-loop system. These techniques may not be limited to power supplies, but may be applicable to other air cooling requirements in assemblies and systems.

20 Claims, 19 Drawing Sheets

(56) References Cited

U.S. PATENT DOCUMENTS

| | | | |
|---|---|---|---|
| 2021/0247822 A1 | 8/2021 | Gao | |
| 2022/0087076 A1 | 3/2022 | Malouin et al. | |
| 2022/0136780 A1* | 5/2022 | Steven | H01L 23/427 |
| | | | 136/259 |
| 2022/0248559 A1* | 8/2022 | Peterson | H05K 7/20818 |

* cited by examiner

TOP CUTAWAY

END CUTAWAY

TOP CUTAWAY

SIDE CUTAWAY

END CUTAWAY

SIDE CUTAWAY

HOT VAPOR

HOT LIQUID

COOLED LIQUID

AIR COOLING, LATENT HEAT COOLING, AND POWER SUPPLY COOLING

CROSS-REFERENCE TO RELATED APPLICATIONS

This application claims priority to U.S. Provisional Patent Application No. 63/336,352, filed Apr. 29, 2022, the entirety of which is incorporated herein by reference.

TECHNICAL FIELD

The present disclosure relates to networking equipment, computing equipment and any electronic or other device or apparatus that generates heat that needs to be cooled or dissipated.

BACKGROUND

Information Technology (IT) equipment (server computers, data storage and networking equipment, etc.) power is increasing, but state-of-the-art air cooling technology is at the limits for higher power and power density, and for satisfying Front-End-Power (FEP) supply IPC-9592 thermal derating under worst-case conditions, and for meeting acoustic noise requirements. There is a need to improve internal fan air cooling capability for higher power and higher power density equipment before requiring external supplied system liquid cooling.

DESCRIPTION OF EXAMPLE EMBODIMENTS

Overview

Figure 1:
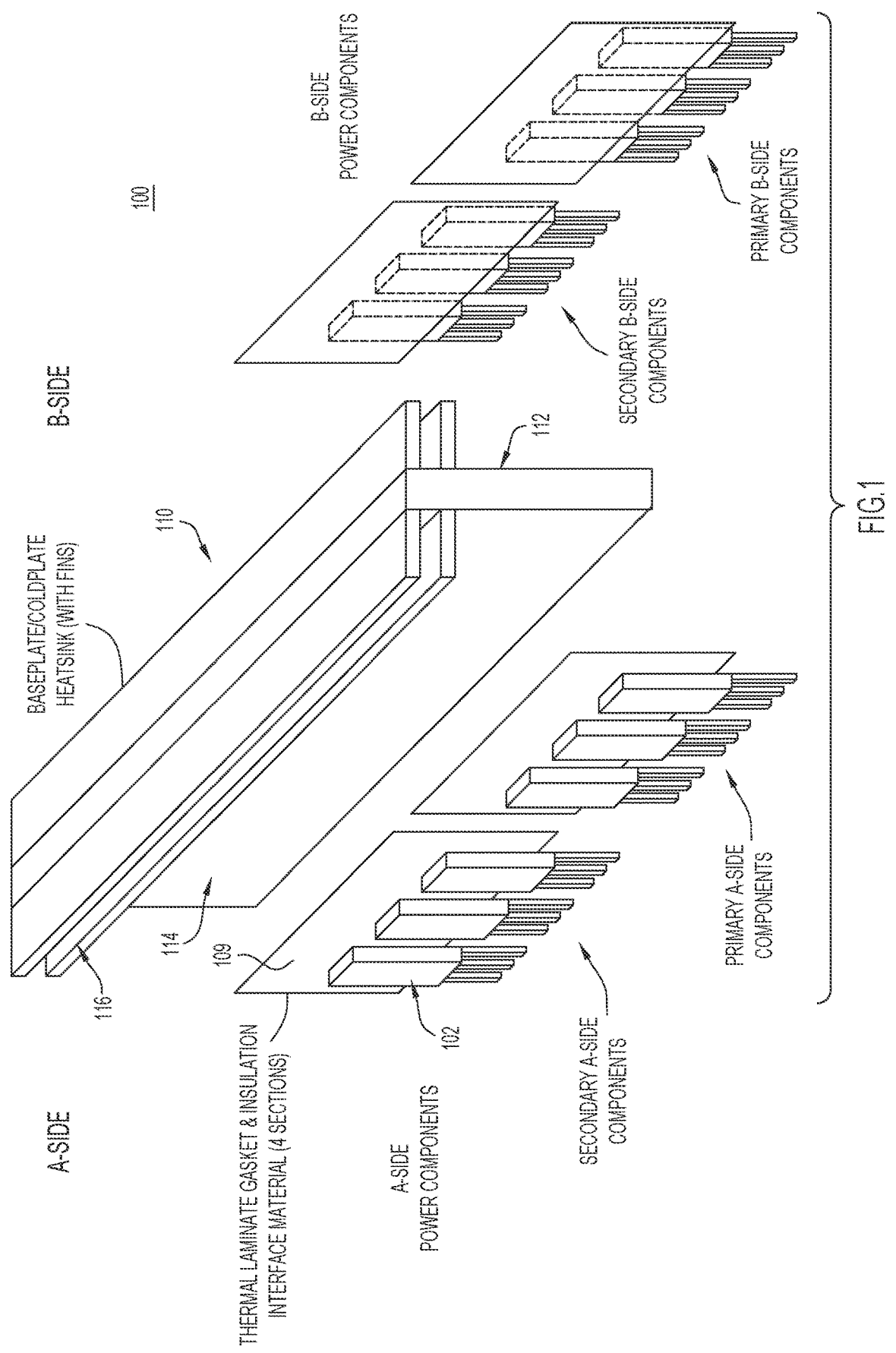
FIG. 1 shows an example system including a plurality of heat generating components and a baseplate/cold-plate heatsink, according to an example embodiment.

Presented herein are techniques to increase air cooling capabilities for heat generating components (e.g., power supplies or other power components) using a latent heat of vaporization cooling method in a single-phase liquid-cooling-to-air closed-loop system. The systems and methods described herein can provide improved air cooling compared to the traditional cooling methods mentioned above, especially for higher power and power density power supplies (including but not limited to front-end-power (FEP) supplies, microcontrollers and application specific integrated circuits (ASICs)).

For example, a local closed-loop cooling system may include single-phase liquid-assisted cooling to a local air heat exchanger, such as from a local fan or blower, or even with convection/conduction self-contained cooling only (for a fan-less module). The goal is to extend air cooling capability as far as possible within a module, board, or system (before requiring external-supplied liquid cooling), to solve the aforementioned air cooling problems in high power and high power density power supplies.

Example embodiments presented herein take advantage of operating the power dissipation heat over the latent heat of vaporization range with a constant (e.g., 100° C.) maximum water temperature heatsink. The water latent heat of vaporization range at a constant (e.g., 100° C.) temperature is used with air cooling in a closed-loop system to cool the supply power dissipation heat over a wide power range. For example, a 100° C. constant maximum heatsink liquid temperature may be controlled over a wide heat energy range (e.g., 300% maximum power range) for power component cooling. Some heat is stored in the water, and only part of the heat may need cooling to the air. This approach improves air cooling efficiency. Less air cooling flow and power is needed since only part of the component heat dissipation energy needs to be cooled to the air, with the other part of the heat dissipation energy being stored in the liquid/water mass.

Example embodiments utilize a central baseplate/cold-plate/heatsink (hybrid design) for the power components heat dissipation cooling, which improves cooling efficiency. In some examples, a high efficiency, high-fin-surface-area, liquid-to-air heat exchanger with directed high air flow may be used (using most of the air volume, in contrast with the traditional lower efficiency air scattered and with blocked air flow components). In some examples, a closed-loop liquid-to-air flow control system may be self-contained within a power supply (e.g., a FEP supply).

In example embodiments where one or more active cooling components are used (e.g., a fan and/or a pump), a thermal sensing and control system may be used for regulation of the constant maximum liquid temperature within the single-phase latent heat of vaporization range.

In one method, a passive thermosiphon liquid pump flow control loop may be employed (in a thermosiphon air-cooled passive-liquid-loop single-phase cooling system). This passive heat pumping liquid flow is a self-contained closed-loop flow system from a baseplate/cold-plate/heatsink to a liquid-to-air heat exchanger from an internal fan/blower air cooling control system with a liquid mass, for maximum power heat load limit at constant maximum liquid temperature within the single-phase latent heat of vaporization range.

In another method, an active electric liquid pump flow control loop may be employed (in an air-cooled forced-liquid-loop single-phase cooling system). This active liquid pump flow is a self-contained closed-loop flow system from a baseplate/cold-plate/heatsink to a liquid-to-air heat exchanger from an internal fan/blower air cooling and pump control system with a liquid mass, for maximum power heat load limit at constant maximum temperature within the single-phase latent heat of vaporization range.

The systems and methods described herein increase the air cooling capability of power supplies (e.g., FEP supplies), from traditional aluminum heatsinks, baseplates or cold-plates, to self-contained single-phase liquid-to-air cooling controlled at constant temperature in the latent heat of vaporization range. This allows improved methods of higher power density internal cooling of power supplies and systems, without the need for an external-supplied liquid cooling system.

EXAMPLE EMBODIMENTS

IT equipment (e.g., server computers, data storage and networking equipment, etc.) and router/switch system power is increasing yearly and creating severe thermal cooling problems on ASICs and power supplies. In one example of a high power system, projected power is expected to increase from 80 KW to ~100-150 KW (or more) in the next few years with ASIC power increasing, which means that Front-End-Power (FEP) supply power density will need to increase from 60 W/in$^3$ to ~90-140 W/in$^3$, with only internal air cooling being preferred (over external-supplied liquid cooling).

However, state of the art internal fan air cooling technology is already at or near its limits of ~70 W/in$^3$ for higher density FEP supplies, and needs to meet IPC-9592 thermal derating at worst-case conditions, plus meet Network Equipment-Building System (NEBS) thermal/altitude, acoustic noise, and line dropout ride-through time requirements.

Currently, power supplies typically use one of the following basic cooling methods:

(1) An FEP supply and most other power components use multiple aluminum heatsinks to conduct heat dissipation through to one or more fins to transfer all of the heat to the air as the thermal heat exchanger, thereby limiting the component temperature through the total thermal resistance well above the air temperature.

(2) Some power components in a board-mounted-power (BMP) supply may use 1-phase liquid cooling from the system or facility cooling source and 2-phase liquid heat pipes and vapor chambers to transfer all of the heat from the power components to multiple thin fins with large surface area to the air as the thermal heat exchanger. This method vaporizes the liquid through the latent heat of vaporization and then back to a liquid, thereby limiting the component temperature through the total thermal resistance above the heat pipe liquid temperature >100° C. (for a water at sea level atmospheric pressure example).

Both of these traditional cooling methods scatter air flow through the supply and around many heatsinks with other blocking components for low usable air flow volume (much of the air flow is blocked and wasted for low effective cooling).

Thus, there is a need to improve internal fan air cooling capability for higher power and higher density equipment, before resorting to a less preferable alternative of using external-supplied system liquid cooling. There is also a need for new innovations with major advances in line cards and FEP supplies to increase cooling capabilities by 130-250% in the next few years.

Presented herein are techniques for operating within a water latent heat of vaporization limit (at "G") with a constant (e.g., 100° C.) maximum water temperature example over a wide range of heatsink thermal power energy operating range from power components, with a maximum heatsink water temperature of 100° C. The advantage of this technique is that air cooling is only needed for any increasing thermal energy above the G-limit, with the remaining thermal energy being stored in the liquid mass. For the example of water as the liquid mass and 100° C. maximum temperature, a latent heat of vaporization region refers to the area around a latent heat of vaporization point (e.g., approximately 540 calories/gram (cal/gram)), between a vaporization/evaporation point ("G" defines an upper limit of approximately 740 cal/gram for the latent heat of vaporization range) and a liquid condensation point ("F" defines a lower limit of approximately 200 cal/gram for the latent heat of vaporization range), each at sea level atmospheric pressure. Thus, the latent heat of vaporization region lies between 200 cal/gram and 740 cal/gram at 100° C. temperature in this non-limiting illustrative example.

A single-phase liquid cooling system and a latent-heat-of-vaporization heatsink cooling method are provided that improves cooling capabilities of loads like micro-controllers and ASICs, and also reduces fan power efficiency losses in power supplies. The method involves using the theoretical capability of operating in the latent-heat-of-vaporization region for heatsink cooling, with single-phase liquid cooling in a heatsink with the ability to store a portion (e.g., some, most, or all) of the heat load energy to be cooled in the liquid mass below the vaporization/evaporation point ("G"), and only needing to cool any excess heat load energy via a heat exchanger, such as to ambient air or to chilled water, for example. Heat storage with heat removal by heat exchanger to air or chilled water provides improved cooling efficiency since only a percentage of the heat needs to be removed. This allows much higher cooling efficiency, whereby much less cooling energy is needed for cooling as compared to a traditional method of removing all or most of the heat load energy to limit the maximum heat sink temperature rise.

With water as the example of single-phase liquid cooling at sea level atmospheric pressure and operating in the latent-heat-of-vaporization region below the vaporization/ evaporation point ("G"), example embodiments described herein will provide the ability to maintain the heatsink at a 100° C. maximum water temperature. As heat energy increases over the operating range from an ambient temperature below 100° C. to a maximum energy that is limited to the water at 100° C. maximum, water volume expansion increases up to 100° C. where the water will boil from a slow bubbling to a faster rate, creating water vapor and steam with an increasing pressure. In practice, this may use a special means to regulate the water expansion, the water vapor and steam, and/or the increasing pressures, as described further below with reference to the figures.

With the heatsink operating at 100° C. maximum water temperature over most of the operating range of load heat energy stored in the water, and cooling any excess energy to regulate below the vaporization/evaporation point as needed, the heat loads can be cooled to safe operating temperature levels with low thermal resistance materials and devices, such as power semiconductor examples of maximum junction temperatures derating to 110° C. maximum for long-life and high-reliability, and may also allow 125° C. maximum for intermittent operation.

When water is used as the liquid coolant in the heatsink and operating in the latent-heat-of-vaporization region at 100° C. maximum, example embodiments may also be described as using a boiling water latent heat cooling method to store heat energy in the water in the heatsink, with air cooling of steam/vapor and boiling water fin cooling, that utilizes latent-heat-of-vaporization to improve cooling efficiency (e.g., storing a portion of heat energy in the latent-heat-of-vaporization range in the example of a water mass boiling at 100° C. between point F (200 cal/gram) and point G (740 cal/gram)). A quantity of heat energy that is stored in the boiling water mass does not need to be cooled by an air heat exchanger, therefore improving thermal cooling efficiency without the need for fan power air flow to fins in a heat exchanger and reducing cooling energy requirements. A maximum heat energy point (e.g., 600 cal/gram in one non-limiting illustrative example described below) may be chosen with margin below the point G (e.g., the 740 cal/ gram limit of vaporization), where a quantity of heat energy in the water mass above this limit will need to be cooled in a heat exchanger with fan power by air flow surface area and/or air-cooling fins.

Now referring to the figures, FIG. 1 shows an example system 100 including a plurality of heat generating components 102 and a baseplate/cold-plate heatsink 110, according to an example embodiment. The system 100 may be used in a power supply (e.g., a front-end power supply, such as a 228 W dual-input FEP supply), for example.

In FIG. 1, the heat generating components 102 (e.g., power components) may include a dual-input line-redundant power supply from A-Bus and B-bus redundant inputs using dual power sections, with primary A-side components, secondary A-side components, primary B-side components, and secondary B-side components, which are configured for attachment to mounting areas on respective sides of the baseplate/cold-plate heatsink 110 via thermal laminate gasket and insulation interface material 109 (e.g., a thermally conductive and insulating interface material such as tape, foil, plates, sheets, etc.). It should be appreciated that the number of A-side components and B-side components are non-limiting and merely illustrative, that different numbers of components may be attached, and that components may be attached to both sides in some examples or one side only in some other examples.

As shown in FIG. 1, the baseplate/cold-plate heatsink 110 may include a baseplate/cold-plate 112, mounting areas 114 on both sides thereof (e.g., A-side mounting area 114 and B-side mounting area 114) for attachment of heat generating components 102, and a plurality of fins 116 extending from the sides (the A-side and/or the B-side) thereof in opposite directions. The baseplate/cold-plate 112 may be made out of metal, such as aluminum and/or copper, for example. The fins 116 may be positioned at or near the top of the baseplate/cold-plate 112 (e.g., above the mounting area 114) and may include multiples of very thin fins with much higher surface area, for example. Below the fins 116, the heat generating components 102 may be thermally linked to the mounting areas 114 of the baseplate/cold-plate 112 using the thermal laminate gasket and insulation interface material 109.

Example embodiments of the baseplate/cold-plate heatsink 110 may effectively utilize most of a power supply's internal volume in the air flow area. Example embodiments may use more of the wasted space in the power supply with a common/shared cooling area for either side's power channel (A side or B side). Example embodiments may provide a custom common/shared heatsink design with fins that may cover or utilize the whole width of the power supply's air flow area as well as the height and length, for example.

In some example embodiments, a vertical baseplate/cold-plate heatsink 110 with air cooling fins 116 and an internal liquid mass 118 may be utilized alone or in combination with various other cooling components (e.g., external heat exchanger, fan, pump, etc.).

Next, additional details of the baseplate/cold-plate heatsink 110 with be described with reference to FIGS. 2A and 2B-2G, which show an external view and various internal views, respectively. It is noted that the baseplate/cold-plate heatsink 110 may be considered a hybrid apparatus, in that it has various different cooling properties such as conduction cooling (like a metal case or baseplate), liquid cooling (like a liquid cold-plate), and convection air cooling (like a heatsink with fins).

Figure 2A:
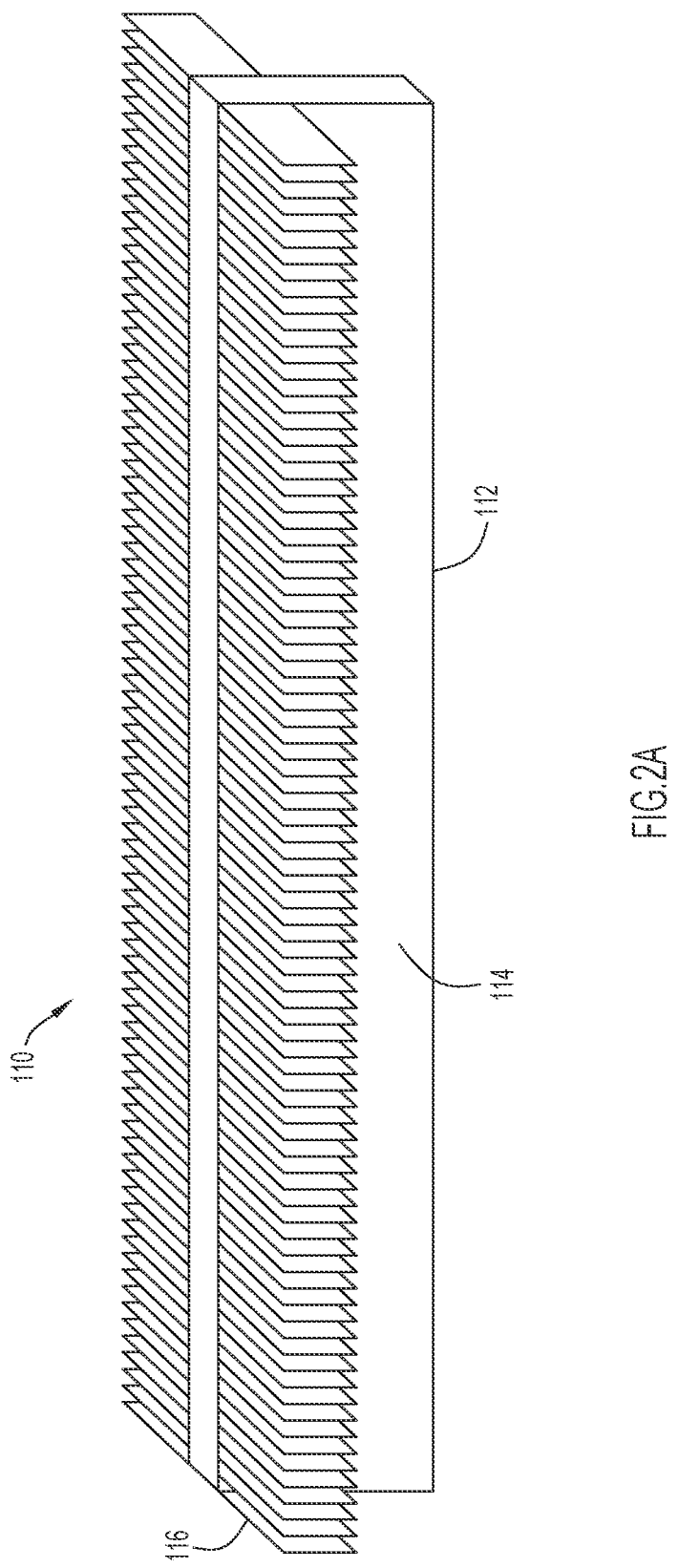
FIG. 2A is an exterior view of the baseplate/cold-plate heatsink, according to an example embodiment.

FIG. 2A is an exterior view of the baseplate/cold-plate heatsink 110, according to an example embodiment. As shown in FIG. 2A, the baseplate/cold-plate heatsink 110 includes a baseplate/cold-plate 112 for liquid/air cooling of heat generating components (e.g., power components), mounting areas 114 on the sides thereof for attachment of the heat generating components, and a plurality of fins 116 extending from one or both sides thereof. Although not shown in FIG. 2A, the baseplate/cold-plate 112 is configured to contain a liquid mass 118 (e.g., water, or a mixture of water and ethylene glycol). In addition to mounting power components, the mounting areas 114 may also provide conduction cooling to the opposite side, the top, and/or the bottom of the baseplate/cold-plate 112. The fins 116 may provide natural convection air cooling on one or both sides (and optionally the top).

An example of water at 100° C. temperature is described herein for simplicity and ease of explanation. However, it should be appreciated that in actual FEP supplies a 50%/50% water/ethylene glycol mixture may be used, which would result in a higher vaporization/evaporation temperature (e.g., 107 C), such the latent heat of vaporization may be different for the heat storage range to regulate within, and suitable adjustments may be made to control parameters according to some other example embodiments.

FIG. 2A is an example of a vertical dual-sided baseplate/cold-plate heatsink using a self-contained water flow loop system within assembly (e.g., without outer flow, and using an internal expansion area and/or air or nitrogen compression head for liquid expansion with temperature), as further explained below with reference to FIGS. 2B-2G.

FIGS. 2A-2G may also be described as a fan-less latent-heat-of-vaporization water cooling method with passive heat pumping in a self-contained baseplate/cold-plate/heatsink. Passive heat pump single-phase water cooling for fan-less cooling, with storing a portion of heat energy in the latent-heat of-vaporization range in the example of a water mass boiling at 100° C., and removing a portion of the heat energy to remain in the latent-heat-of-vaporization range, may provide improved local cooling efficiency. The vertical dual-sided baseplate/cold-plate/heatsink uses self-contained passive liquid convection heat pumping in the vertical axis for thermal flow using gravity assist. This is an example of self-contained water flow in a closed-loop system within assembly within 100° C. maximum latent heat of vaporization region, without fan power or a powered pump. Single-phase controlled water cooling at 100° C. maximum for controlling temperature rise to 125° C. junction temperature limit for worst-case stress full-load derating, with low or no air flow cooling power needed. Additional heat removal is possible by conduction cooling to a case or frame or outside the heatsink, or may be part of the case, and by natural convection air cooling with vertical thin-fin high-surface-area heatsink strip assemblies (which may be added as applicable to the baseplate/cold-plate and power components).

Figures 2B, 2C, 2D, 2E, 2F:
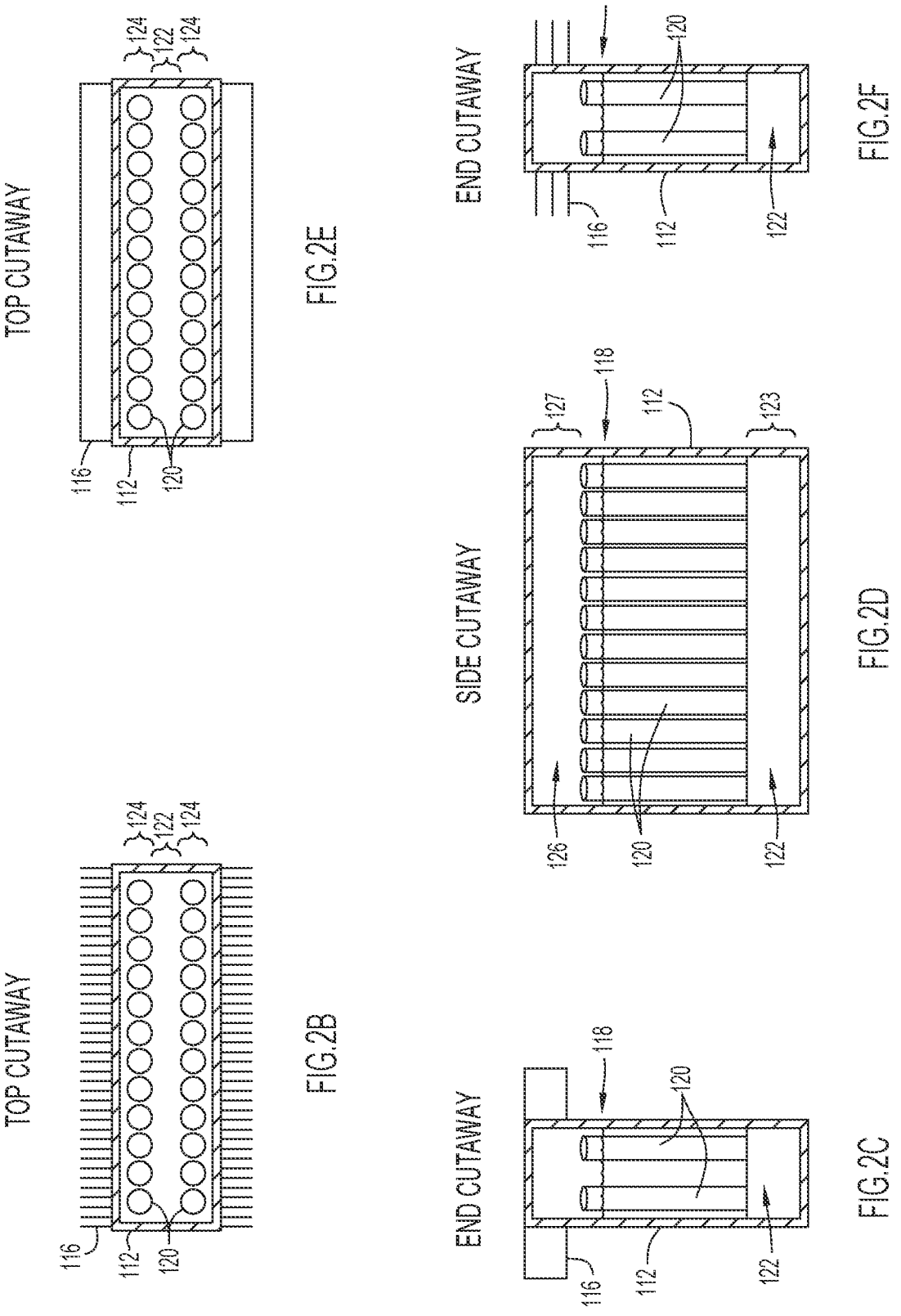
FIG. 2B is a top interior (cutaway) view of the baseplate/cold-plate heatsink of FIG. 2A, according to an example embodiment.
FIG. 2C is an end interior (cutaway) view of the baseplate/cold-plate heatsink of FIG. 2A, according to an example embodiment.
FIG. 2D is a side interior (cutaway) view of the baseplate/cold-plate heatsink of FIG. 2A, according to an example embodiment.
FIG. 2E is a top interior (cutaway) view of the baseplate/cold-plate heatsink of FIG. 2A, but with a different configuration of the fins, according to an example embodiment.
FIG. 2F is an end interior (cutaway) view of the baseplate/cold-plate heatsink of FIG. 2A, but with a different configuration of the fins, according to an example embodiment.

FIG. 2B is a top interior (cutaway) view of the baseplate/cold-plate heatsink 110 of FIG. 2A. FIG. 2C is an end interior (cutaway) view of the baseplate/cold-plate heatsink 110 of FIG. 2A. FIG. 2D is a side interior (cutaway) view of the baseplate/cold-plate heatsink 110 of FIG. 2A.

As shown in FIGS. 2B-2D, in addition to the liquid mass 118, the baseplate/cold-plate 112 may have a plurality of internal tube-type channels or micro-channels 120 housed therein. For example, there may be two rows of internal micro-channels 120 on opposite sides of the baseplate/cold-plate 112, with some space in between the two rows. The internal micro-channels 120 may be vertical capillary/percolator tubes for hot water vertical convection flow with gravity assist, and may be made out of a metal (e.g., preferably copper, or possibly aluminum) or other suitable material. In these examples, heat energy is heatsinked on the outside bottom section on one or both long-sides into the 100° C. water inside, and using a passive pump convection flow method (no powered pump) to move water to the top heat exchanger cooling area with convection natural air flow cooling or fan powered air-cooling fins. In some example embodiments, the internal micro-channels 120 may have a vertical height dimension that provides a relatively short path instead of a relatively long path (e.g., more like a heat-pipe, and less like a thermosiphon).

The baseplate/cold-plate 112 may have a cooler liquid area 122 (e.g., a cooler water reservoir in the areas between and below the micro-channels 120), a hot liquid area 124 (e.g., hot water in the area of the internal micro-channels 120), and a steam/vapor area 126 (e.g., compressible gas pressure head area, steam/vapor and boiling water cooling area). Generally, the lower part of the interior of the baseplate/cold-plate 112 (e.g., cooler liquid area 122) is a low pressure area 123, and the upper part of the interior of the baseplate/cold-plate 112 (e.g., steam/vapor area 126) is a high pressure area 127.

The passive pump convection flow needs a pressure differential for effective vertical water flow to the top heat exchanger cooling area. This may be provided with the water in thin vertical chambers, tubes, or micro-channels on the heatsinked sides that absorb the heat energy to create a high thermal gradient between the cooler water at the bottom and the hotter water at the top, using capillary-type flow and/or percolation-type water pumping vertically with gravity assist.

The boiling water also creates expansion, pressure increase, and water vapor that needs to be handled. These aspects are handled in the upper cooling chamber with a compressible air-head (or other compressible gas, e.g., nitrogen) for a low pressure increase, and an area where hot water and hot vapor/steam is cooled and condensed by the top area heat exchanger. The cooled and/or condensed water from the top heat exchanger area is then returned to the bottom cooler area of the baseplate/cold-plate/heatsink through the middle width cross section cool water area to restart the thermal flow cycle again.

The fins 116 may be vertical fins (that are more effective for natural convection air cooling) that are stacked horizontally with respect to each other along the length of the baseplate/cold-plate 112, as shown in the examples of FIGS. 2A-2C. However, the fins 116 may alternatively be horizontal fins (that are more effective for fan-powered forced-air flow) that are stacked vertically with respect to each other, with each fin extending the length of the baseplate/cold-plate 112, as shown in the examples of FIGS. 2E and 2F.

FIG. 2E is a top interior (cutaway) view of the baseplate/cold-plate heatsink 110 of FIG. 2A, and FIG. 2F is an end interior (cutaway) view of the baseplate/cold-plate heatsink 110 of FIG. 2A, but with a different configuration of the fins 116 (i.e., horizontal fins, stacked vertically), according to another example embodiment. Other than the different configuration of the fins 116, the same description as FIGS. 2B and 2C applies with regard to FIGS. 2E and 2F. Thus, it should be appreciated that either configuration of fins 116 (i.e., vertical fins or horizontal fins) may be interchangeable in any given example embodiment described herein. Although not shown in FIGS. 2A-2E, the baseplate/cold-plate 112 may additionally or alternatively include fins extending from the top thereof (refer to FIG. 2G).

Figure 2G:
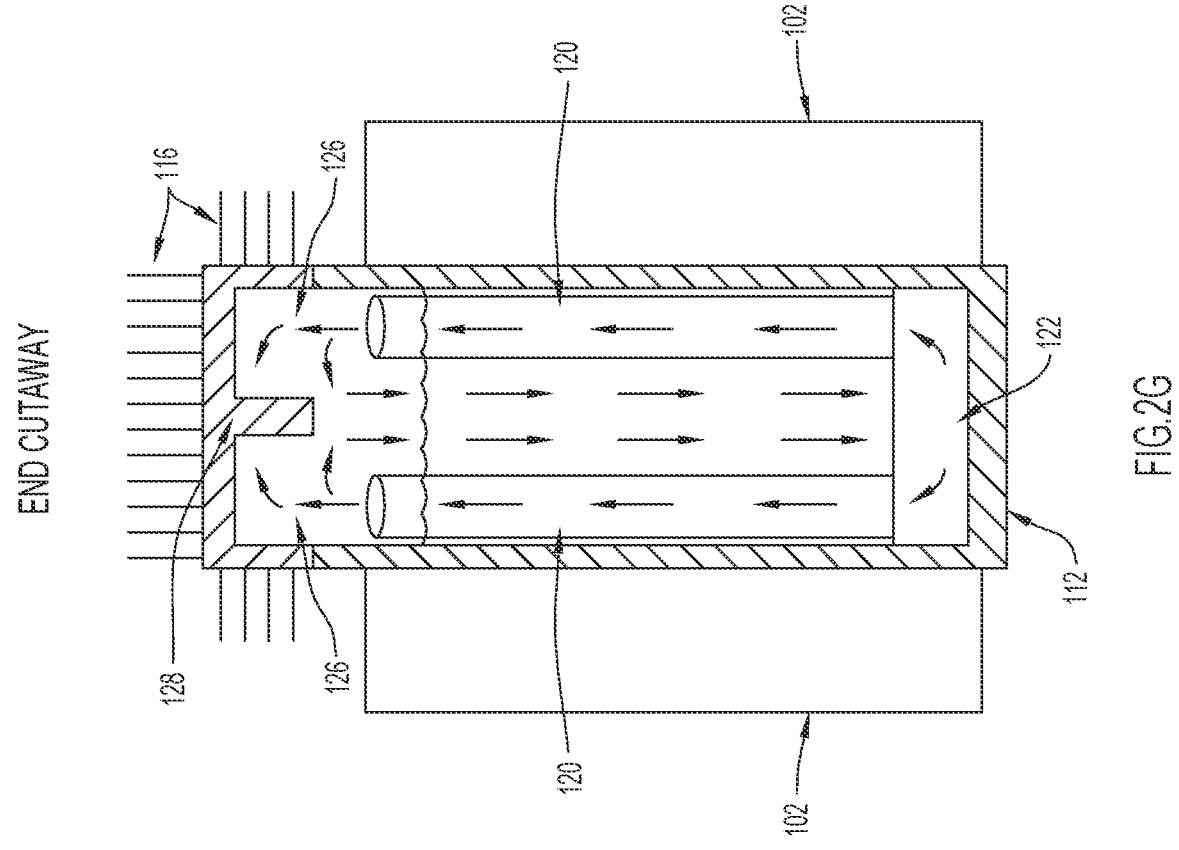
FIG. 2G is an end interior (cutaway) view of the baseplate/cold-plate heatsink of FIGS. 2A-2F that is enlarged to illustrate additional details, according to an example embodiment.

FIG. 2G is an end interior (cutaway) view of the baseplate/cold-plate heatsink 110 of FIGS. 2A-2F that is enlarged to illustrate additional details, according to an example embodiment.

As shown in FIG. 2G, one or more heat generating components 102 to be cooled via the baseplate/cold-plate heatsink 110 may be attached to one or both sides of the baseplate/cold-plate 112 at the mounting areas 114. The fins 116 extending from the sides of the baseplate/cold-plate 112 may be horizontal fins (like the configuration in FIGS. 2E and 2F) and may further include fins 116 extending vertically from the top of the baseplate/cold-plate 112. Although top fins are only shown in FIG. 2G, it is noted that any other example embodiments described herein may also include top fins, instead of or in addition to side fins. Also, the top area of the baseplate/cold-plate 112 of FIGS. 2A, 2C, 2D, 2F, and 2G may mount or attach to a cold-plate, heatsink, or heat spreader for an additional or final heat exchanger stage.

In the example shown in FIG. 2G, the top of the baseplate/cold-plate 112 may include a condenser cooling chamber 128. The condenser cooling chamber 128 may surround the hot water/steam/vapor area 126 (e.g., compressible gas pressure head area, steam/vapor and boiling water cooling area). In some example embodiments, the condenser cooling chamber 128 may extend downward and at least partially split the steam/vapor area 126 (e.g., A-side and B-side). Although not shown in FIGS. 2B-2F, these examples may also include the condenser cooling chamber 128 shown in FIG. 2G.

FIG. 2G illustrates internal flow within the baseplate/cold-plate heatsink 110, as represented by arrows. During operation, as heat is transferred from the heat generating components 102 to the baseplate/cold-plate 112, the liquid increases in temperature and rises further in the internal micro-channels 120 as the liquid heats up. Hot water and steam/vapor may exit the internal micro-channels and enter the hot water/steam/vapor area 126 within the baseplate/cold-plate 112. The hot water and steam/vapor in the hot water/steam/vapor area 126 may be cooled via the condenser cooling chamber 128 and the fins 116, such that the hot water is cooled and the steam/vapor is transformed back into its liquid state, and cooled liquid cycles back down to the cooler liquid area 122 (e.g., cooler water reservoir in between and below the internal micro-channels 120) within the baseplate/cold-plate 112.

As mentioned above, there is a pressure differential needed to move the water vertically to the cooling chamber for proper operation. This may be dependent upon variables of temperature differential between the two ends of the internal micro-channel (percolator tube), the mean water temperature in the internal micro-channel or percolator tube, the length/height of the internal micro-channel or percolator tube, and the flow rate, for example. In the latent heat of vaporization range, the water is boiling with small bubbles forming at the low end of point F (200 cal/gram), boiling rapidly at the operating maximum (e.g., 600 cal/gram), to boiling very rapidly at the high end of point G (740 cal/gram). All of these boiling vapor bubbles cause hot water to flow vertically up the internal micro-channels, proportional to the boiling level (including with percolation).

A passive energy pump method creates liquid flow using the source heat energy being cooled by the heatsink to provide the heat energy as power as a type of heat pump to create the liquid flow (in contrast with using an active pump method of for a mechanical or electrical energy pump). This method uses the liquid boiling method to force liquid to flow vertically upward in the micro-channels with gravitational support, such as a thermosiphon or a percolation method. Stated differently, kinetic energy may provide a passive heat pumping effect without the need for a separate electrical/mechanical pump.

Thus, FIGS. 2A-2G provide examples of a passive heat pump closed-loop liquid/air cooled heatsink with single-phase cooling with latent heat storage in the liquid mass 118 contained in the baseplate/cold-plate 112. The internal micro-channels 120 and the hot water/steam/vapor area 126 provide a passive water-pumping and percolating effect, in combination with a boiling water cooling effect provided by the condenser cooling chamber 128 and the fins 116.

In some instances, the baseplate/cold-plate heatsink 110 may provide sufficient cooling capacity without any other external components. However, the baseplate/cold-plate heatsink 110 may also be utilized in combination with one or more passive cooling components and/or active cooling components that are separate and distinct from the baseplate/cold-plate heatsink 110, in order to provide additional cooling capacity and/or the ability to fine-tune controls for one or more active cooling components to adapt to different operating conditions and/or cooling requirements. For example, the liquid mass alone may only be able to support a certain amount of heat energy storage without any other cooling techniques being implemented, such that water flow with added water in a pump, condenser, and expansion bellows, plus additional fins on the baseplate/cold-plate/heatsink and power components may be incorporated for additional heat removal and cooling. Non-limiting examples of external cooling components may include, but are not limited to, an external heat exchanger, a fan, a pump, and a controller, as described in connection with the example embodiments below.

Ideally, it would be advantageous to store as much of the heat energy in the liquid/water mass as possible, and cool as little heat energy as possible by the fan power air flow, for the best cooling efficiency improvement. However, the maximum amount of heat energy that may be stored in the liquid/water mass (and hence, the excess amount of heat energy that needs to be cooled to the air) may depend on the actual volume of the liquid/water mass that is available for the heat energy to cool.

Figure 3A:
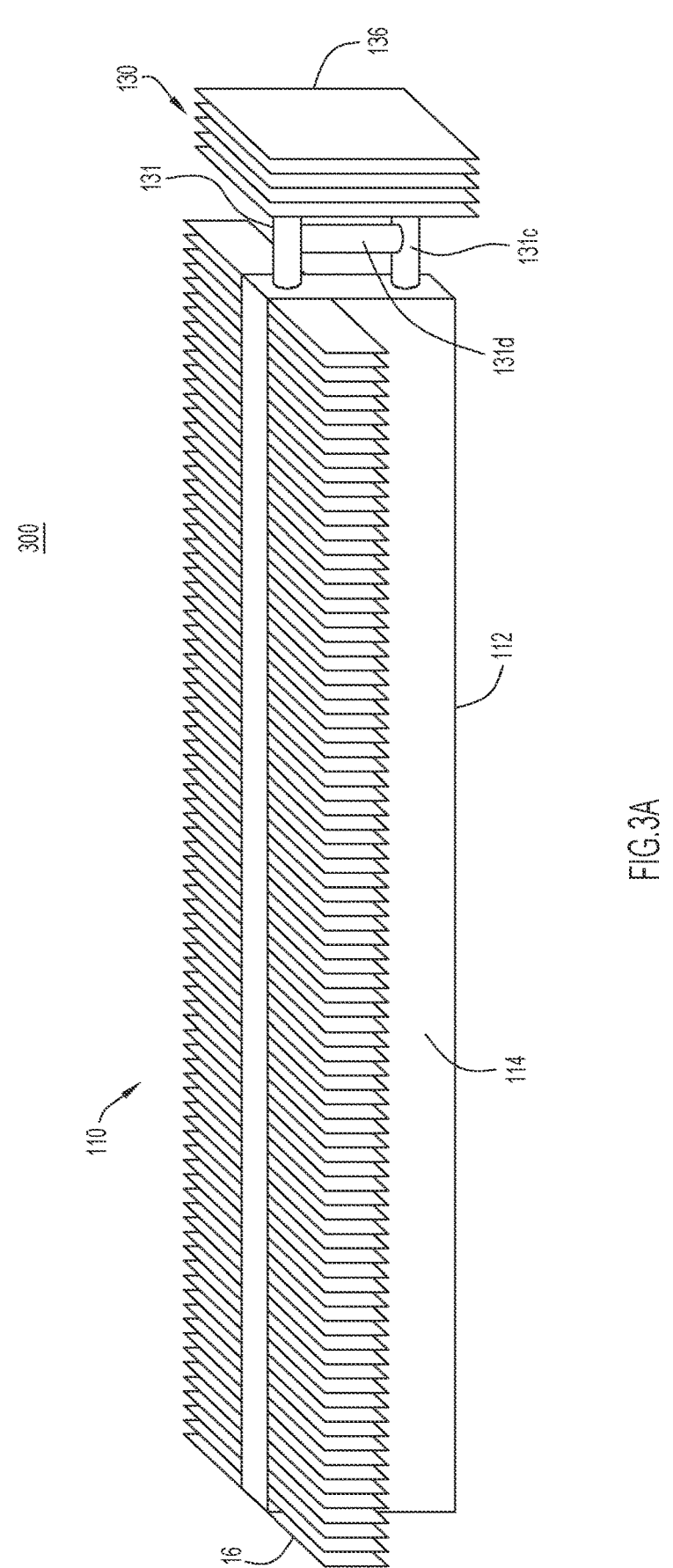
FIG. 3A is an exterior view of a system including the baseplate/cold-plate heatsink of FIG. 2A coupled with an external heat exchanger, according to an example embodiment.

FIG. 3A is an exterior view of a system 300 including the baseplate/cold-plate heatsink 110 of FIG. 2A coupled with an external heat exchanger 130, according to an example embodiment.

As shown in FIG. 3A, the external heat exchanger 130 may be or include a bellows expansion chamber for controlling the pressure increase with water heat expansion, with a plurality of fins 136. The external heat exchanger 130 may also be referred to as a liquid-air heat exchanger radiator with high surface area, thin-fin convection air cooling fins, or a bellows water expansion chamber with passive water return and vertical gravity-assisted convection flow heat exchanger, for example. The baseplate/cold-plate 112 may be connected to the external heat exchanger 130 via at least one upper pipe 131 (e.g., refer to the first pipe 131*a* and the second pipe 131*b* of FIG. 3B) and a lower pipe 131*c* (e.g., refer to the third pipe 131*c* of FIG. 3B). In some example embodiments, there may also be a passive liquid return loop 131*d* connecting the upper pipe 131 and the lower pipe 131*c*. However, the passive liquid return loop 131*d* is optional, and may be omitted in some other example embodiments (e.g., refer to FIG. 3B). It is noted that an expansion limit switch and/or a temperature sensor may provide protection from overheating into possible vaporization thermal zone (refer to FIGS. 7C and 8C).

FIG. 3A is an example of a fan-less vertical dual-sided baseplate/cold-plate heatsink with vertical fins for improved natural convection air cooling using a self-contained passive water flow closed-loop system (e.g., with closed-loop outer flow, and using an internal expansion area and/or air or nitrogen compression head for liquid expansion with temperature), as further explained below with reference to FIG. 3B.

Figure 3B:
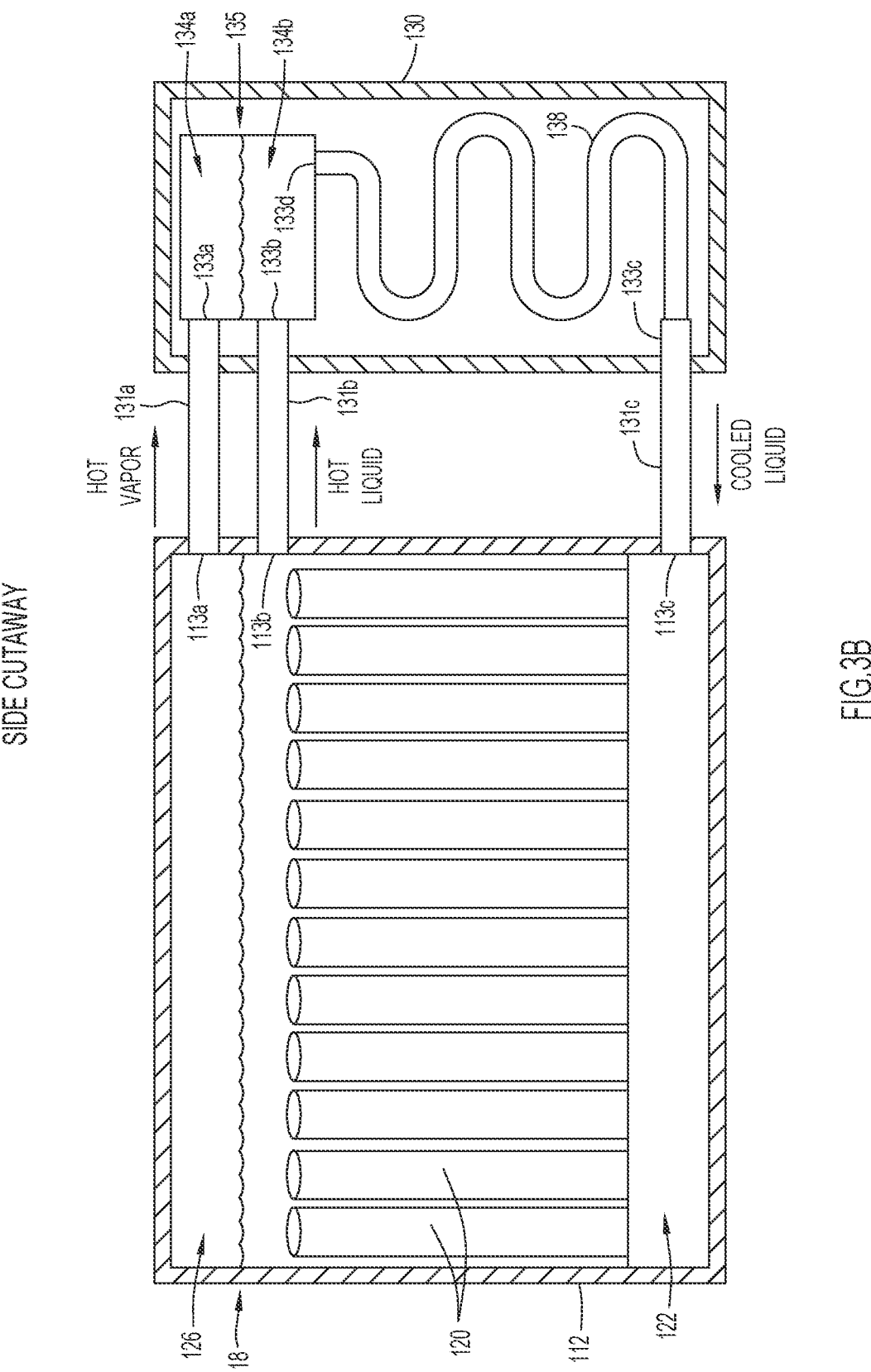
FIG. 3B is a side interior (cutaway) view of the baseplate/cold-plate heatsink coupled with the external heat exchanger of FIG. 3A, according to an example embodiment.

FIGS. 3A-3B may also be described as a fan-less latent-heat-of-vaporization cooling method with passive heat pump and external heat exchanger heatsink design. Storing heat energy within the water mass latent heat vaporization range provides improved local cooling efficiency. The vertical dual-sided baseplate/cold-plate/heatsink single-phase cooling design uses self-contained passive liquid convection heat pump water flow in a closed-loop system, with storing a portion of heat energy in the latent-heat-of-vaporization range with margin for the example of a water mass boiling at 100° C., and removing a portion of the heat energy to remain in the latent-heat-of-vaporization range, without fan power or a powered pump. Single-phase controlled water to 100° C. maximum for controlled temperature rise limit to 125° C. junction temperature limit for worst-case stress and full-load derating with low air flow cooling power needed. Additional heat removal is possible by conduction to case or outside heatsink, or be part of case, and by natural convection air with vertical thin-fin high-surface-area heatsink strip assemblies (which may be added as applicable to the baseplate/cold-plate and power components).

FIG. 3B is a side interior (cutaway) view of the baseplate/cold-plate heatsink 110 coupled with the external heat exchanger 130 of FIG. 3A, according to an example embodiment.

As previously described, the baseplate/cold-plate heatsink 110 may include the liquid mass 118 (e.g., water), the internal micro-channels 120 (percolator tubes), and the steam/vapor area 126. As shown in FIG. 3B, one end of the baseplate/cold-plate 112 has a hot water/steam/vapor outlet port 113*a* (high pressure steam/vapor exit to external heat exchanger) adjacent to the steam/vapor area 126, a hot liquid outlet port 113*b* (high pressure water exit to external heat exchanger) adjacent to the hot liquid area 124, and a cooled liquid inlet port 113*c* (lower pressure water return from external heat exchanger) adjacent to the cooler liquid area 122.

As shown in FIG. 3B, one end of the external heat exchanger 130 has a hot water/steam/vapor inlet port 133*a* (receives high pressure steam/vapor from hot water/steam/vapor area 126 of the baseplate/cold-plate 112), a hot liquid inlet port 133*b* (receives high pressure hot water exiting from hot liquid area 124 of the baseplate/cold-plate), and a cooled liquid outlet port 133*c* (returns lower pressure cooled water to cooler liquid area 122 of the baseplate/cold-plate). The hot water/steam/vapor outlet port 113*a* is connected with the hot water/steam/vapor inlet port 133*a* via a first pipe 131*a*, the hot liquid outlet port 113*b* is connected with the hot liquid inlet port 133*b* via a second pipe 131*b*, and the cooled liquid inlet port 113*c* is connected with the cooled liquid outlet port 133*c* via a third pipe 131*c*. It is noted that FIG. 3B is not drawn to scale, and the actual length of the pipes 131*a*, 131*b*, 131*c* (and hence the distance between the baseplate/cold-plate heatsink 110 and the external heat exchanger 130) may vary. Likewise, the thickness or diameter of the pipes 131*a*, 131*b*, 131*c* may vary, which may permit different levels of throughout within the closed-loop system.

The external heat exchanger 130 may include an internal expansion chamber 135 disposed at an upper portion thereof, with a steam/vapor area 134*a* adjacent to the hot water/steam/vapor inlet port 133*a* and a hot liquid area 134*b* adjacent to the hot liquid inlet port 133*b*. The internal expansion chamber 135 may further include an internal drainage port 133*d*, which is connected with the cooled liquid outlet port 133*c* via internal piping 138 (e.g., a serpentine tube). In some example embodiments, the level of the liquid mass 118 in FIG. 3B may be higher or full, and the inlet ports 133*a* and 133*b* may be combined as one to have hot water and steam/vapor combined that enter the expansion chamber 135 for cooling in the external heat exchanger 130.

Figure 4A:
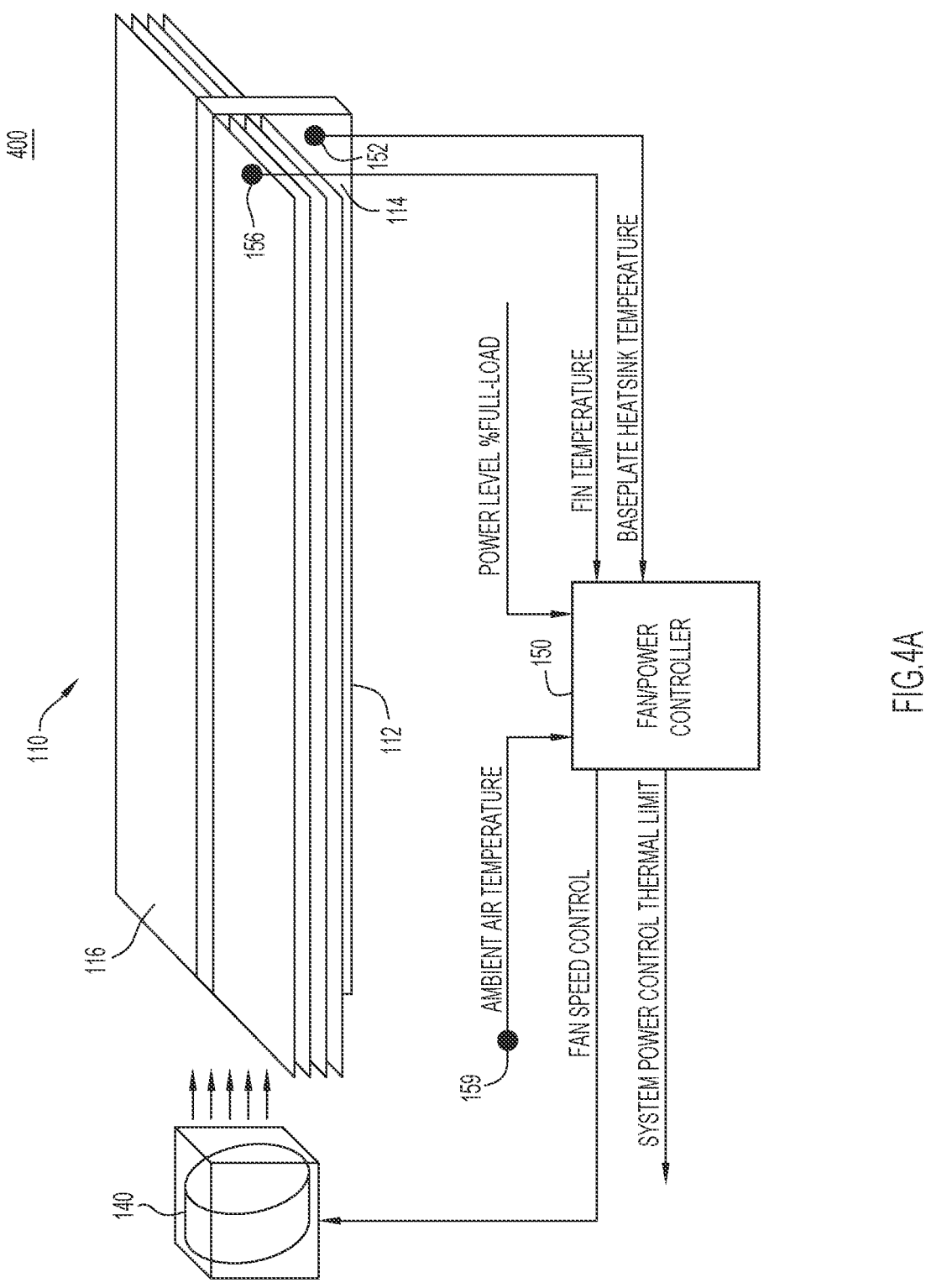
FIG. 4A is a diagram of a system including a baseplate/cold-plate heatsink, a fan adjacent to the baseplate heatsink, and a controller coupled to the fan, according to an example embodiment.

FIG. 4A is a diagram of a system 400 including a baseplate/cold-plate heatsink 110, a fan 140 adjacent to the baseplate heatsink, and a controller 150 coupled to the fan, according to an example embodiment.

As shown in FIG. 4A, the system 400 may include a plurality of sensors, including but not limited to a sensor 152 attached to the baseplate/cold-plate 112 and configured to measure/detect a temperature of the baseplate/cold-plate 112, a sensor 156 attached to the fin(s) 116 and configured to measure/detect a temperature of the fins 116, and a sensor 159 configured to measure/detect ambient air temperature.

Inputs to the fan/power controller 150 may include a power level (% Full-Load), and one or more measurements from the sensors 152, 156, 159. Outputs from the fan/power controller 150 may include fan speed control (for controlling the fan 140) and system power control thermal limit. The fan/power controller 150 is configured to control the fan 140, based on the measurements from the sensors, to provide forced-air cooling for components adjacent to the fan 140 (including but not limited to the baseplate/cold-plate heatsink 110).

In some example embodiments, the controller 150 may be an analog proportional-integral-derivative (PID) amplifier controller (e.g., controls operations based on a set-point or nominal value). In some other example embodiments, the controller 150 may be a hysteretic controller (e.g., controls operations based on an upper limit and a lower limit).

FIG. 4A is an example of a vertical dual-sided baseplate/cold-plate heatsink using a self-contained passive water flow loop system within assembly (e.g., without outer flow, and using an internal expansion area and/or air or nitrogen compression head for liquid expansion with temperature) with a fan cooling control loop.

FIG. 4A may also be described as a fan-in latent-heat-of-vaporization cooling method with passive heat pump in a self-contained heatsink with a cooling control loop. The self-contained passive heat pump single-phase water cooling method uses a local fan air and/or power source control loop to regulate removal of the additional heat above the stored heat energy to stay within the water mass latent heat vaporization range, for improved local cooling efficiency. The vertical dual-sided baseplate/cold-plate/heatsink single-phase cooling method uses self-contained passive liquid convection heat pumping in a self-contained passive heat pump water flow loop system within assembly, within the 100° C. latent heat of vaporization area, with fan control and without pump power.

This example may control the power to the heat source being cooled in a fan-less system, or may include controlling the fan power and air flow across the fins on the heat exchanger top area to regulate the water-stored thermal energy at a maximum cal/gram limit. Control of the cooling control loop may include one or more sensors for ambient air temperature, baseplate/cold-plate/heatsink temperatures, and/or fin temperatures. Other sensors may include water temperature, water expansion, and internal pressure. A preferred sensing method for control may measure the portion of the stored heat energy in the latent-heat-of-vaporization range in the water mass for a maximum cal/gram limit. These sensing methods and the control algorithm may be determined during a pre-calibration process, for example. Internal pressure-to-thermal-energy or water expansion-tothermal-energy may provide the best sensing methods, for example. A pressure sensor in the top of the baseplate/cold-plate/heatsink may indicate proper cooling operation and may be determined in a pre-calibration stage of development or production. A pressure transducer may be used to regulate the fan power and flow rate at limit to the maximum cal/gram water heat energy level. A maximum temperature may also be interlocked with the power to the heat source energy being cooled to turn off power if the heat energy is too high for the fans to cool, or if the latent heat cooling heatsink cooling loop is not working correctly.

Figure 4B:
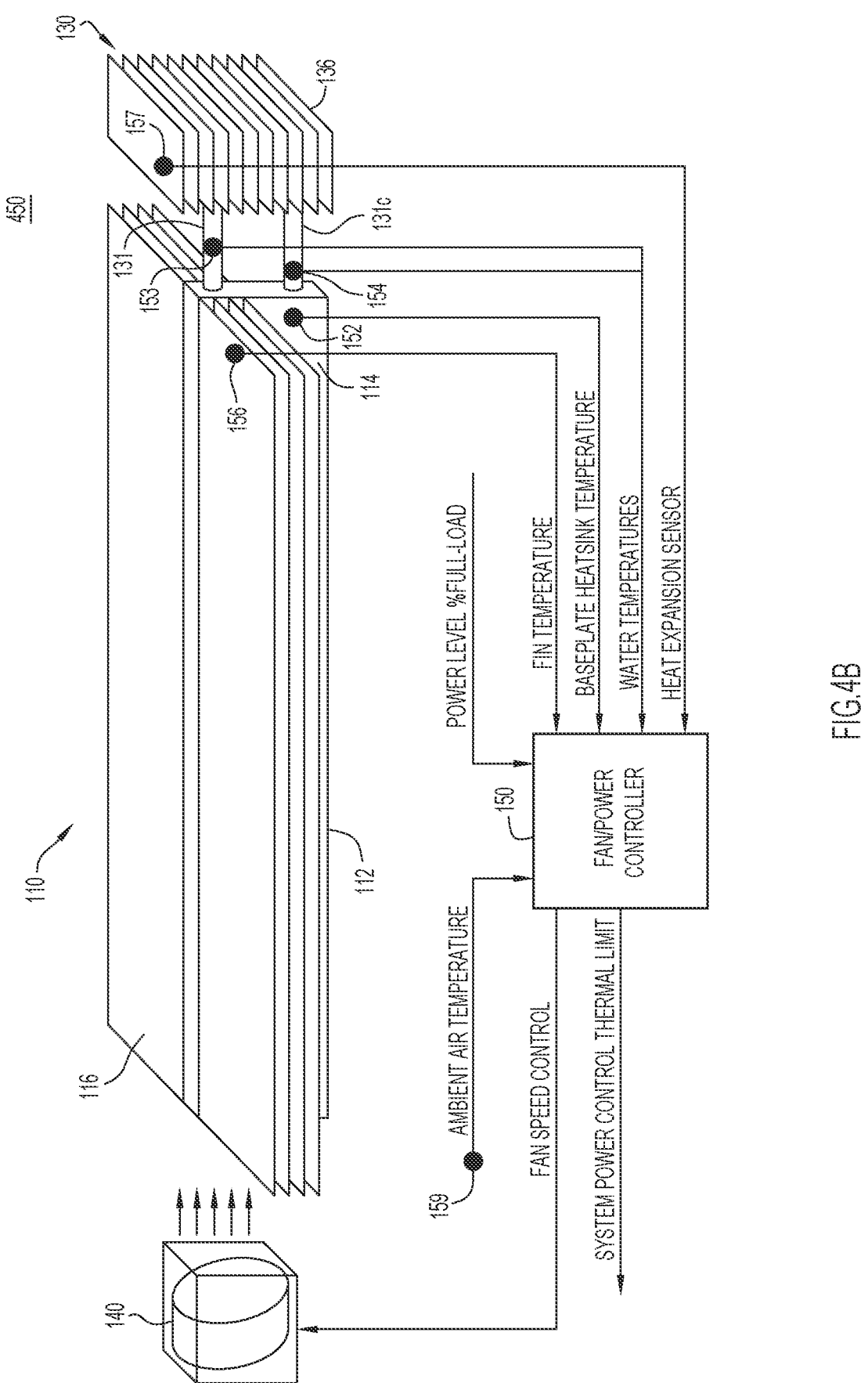
FIG. 4B is a diagram of a system including a baseplate/cold-plate heatsink, an external heat exchanger, a fan, and a controller coupled to the fan, according to an example embodiment.

FIG. 4B is a diagram of a system 450 including a baseplate/cold-plate heatsink 110, an external heat exchanger 130, a fan 140, and a controller 150 coupled to the fan, according to an example embodiment.

As shown in FIG. 4B, the system 450 may include additional sensors, including a sensor 153 attached to the upper pipe 131 (e.g., the second pipe 131*b* of FIG. 3B), a sensor 154 attached to the lower pipe 131*c*, and a sensor 157 attached to the external heat exchanger 130 (e.g., the internal expansion chamber or the air cooling fins thereof). The sensor 153 and the sensor 154 may be configured to measure liquid temperature (e.g., hot water and cooled water, respectively), and the sensor 157 may also be referred to as a heat expansion sensor.

Inputs to the fan/power controller 150 may include a power level (% Full-Load), and one or more measurements from the sensors 152, 153, 154, 156, 157, 159. Outputs from the fan/power controller 150 may include fan speed control (for controlling the fan 140) and system power control thermal limit. The fan/power controller 150 is configured to control the fan 140, based on the measurements from the sensors, to provide forced-air cooling for components adjacent to the fan 140 (including but not limited to the baseplate/cold-plate heatsink 110).

FIG. 4B is an example of a vertical dual-sided baseplate/cold-plate heatsink using a self-contained passive water flow closed-loop system (e.g., with closed-loop outer flow, and using an internal expansion area and/or air or nitrogen compression head for liquid expansion with temperature) with a fan cooling control loop. In other words, the example of FIG. 4B combines different aspects of the examples of FIGS. 3A-3B and 4A, respectively.

FIG. 4B may also be described as a fan-in latent-heat-of-vaporization cooling method with passive heat pump and external heat exchanger heatsink with a cooling control loop. The passive heat pump single-phase closed-loop water cooling design uses a local fan air and/or power source control loop (without water pump power) to regulate removal of the additional heat above the stored heat energy to stay within the water mass latent heat vaporization range, for improved cooling efficiency. This may be an example of a passive thermosiphon liquid pump flow control loop. The vertical dual-sided baseplate/cold-plate/heatsink single-phase cooling method uses a self-contained passive convection heat pump water flow loop in a closed-loop system, within the 100° C. latent heat of vaporization area, with fan control and without pump power. In this example, the external heat exchanger may also provide fin expansion for the water heat expansion and regulate water pressure increases.

Other sensors may include water temperature, water expansion, and internal pressure. A preferred sensing method for control may measure the portion of the stored heat energy in the latent-heat-of-vaporization range in the water mass for a maximum cal/gram limit. These sensing methods and the control algorithm may be determined during a pre-calibration process, for example. Internal pressure-to-thermal-energy or water expansion-to-thermal-energy may provide the best sensing methods, for example. A pressure sensor in the top of the baseplate/cold-plate/heatsink may indicate proper cooling operation and may be determined in a pre-calibration stage of development or production. A pressure transducer may be used to regulate the fan power and flow rate at limit to the maximum cal/gram water heat energy level. A maximum temperature may also be interlocked with the power to the heat source energy being cooled to turn off power if the heat energy is too high for the fans to cool, or if the latent heat cooling heatsink cooling loop is not working correctly. This allows additional sensors of inlet and outlet water temperatures and external heat exchanger fin temperatures and water heat expansion.

A smart control loop for fan speed control may maintain the water latent heat storage within a controlled point or range of stored heat at 100° C. water temperature with a known difference (e.g., measured, calibrated, or controlled) between the 100° C. water and the heatsink temperature (with heatsink temperature sensing and/or water expansion sensing), to correlate to power heat energy in the water mass. A controller 150 (e.g., analog PID amplifier control loop or hysteretic control loop) may control the fan speed air flow for heat removal to maintain the liquid/water mass within the 100° C. enthalpy of vaporization/evaporation (latent heat) range over high power load operating ranges with temperatures and differences (e.g., over the full-load power supply heat losses). Overtemperature and overpressure/expansion protection may be included to control the system power source.

Figure 5A:
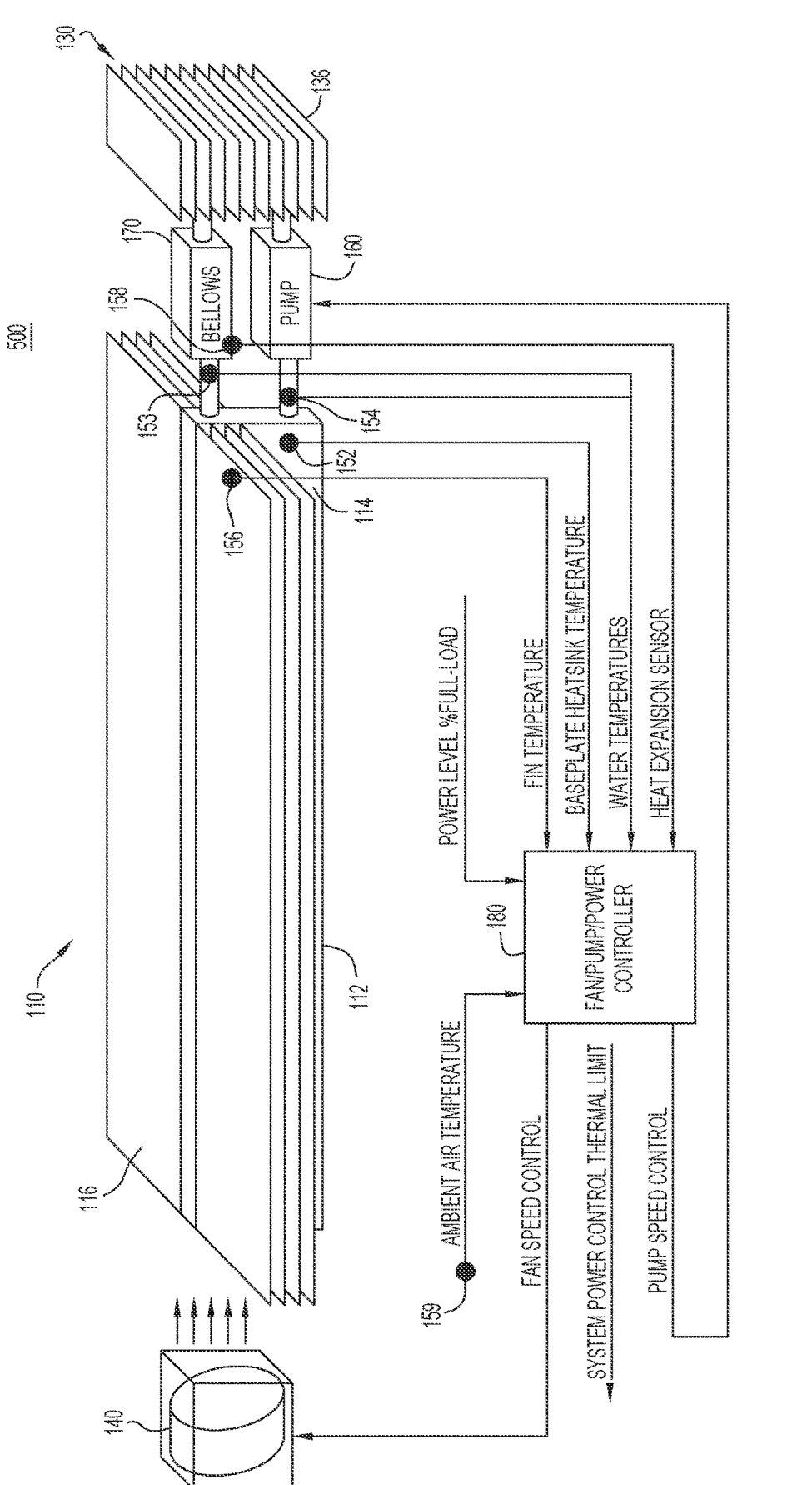
FIG. 5A is a diagram of a system including a baseplate/cold-plate heatsink, an external heat exchanger, a fan, a pump, and a controller coupled to the fan and the pump, according to an example embodiment.

FIG. 5A is a diagram of a system 500 including a baseplate/cold-plate heatsink 110, an external heat exchanger 130, a fan 140, a pump 160, and a controller 180 coupled to the fan and the pump, according to an example embodiment. In addition to the pump 160, the system 500 may also include an outer bellows expansion chamber 170. The bellows expansion chamber 170 and the pump 160 are connected between the baseplate/cold-plate 112 and the external heat exchanger 130.

As shown in FIG. 5A, the system 500 may include a plurality of sensors, including but not limited to a sensor 152 attached to the baseplate/cold-plate 112 and configured to measure/detect a temperature of the baseplate/cold-plate 112, a sensor 153 attached to the upper pipe 131 (e.g., the second pipe 131*b* of FIG. 3B) and configured to measure/detect liquid temperature (e.g., hot water temperature), a sensor 154 attached to the lower pipe 131*c* (e.g., the third pipe 131*c* of FIG. 3B) and configured to measure/detect liquid temperature (e.g., cooled water temperature), a sensor 156 attached to the fin(s) 116 and configured to measure/detect a temperature of the fins 116, a sensor 158 attached to the bellows expansion chamber 170 (also referred to as a heat expansion sensor), and a sensor 159 configured to measure/detect ambient air temperature.

Inputs to the fan/pump/power controller 180 may include a power level (% Full-Load), and one or more measurements from the sensors 152, 153, 154, 156, 158, 159. Outputs from the fan/pump/power controller 180 may include fan speed control (for controlling the fan 140), pump speed control (for controlling the pump 160), and system power control thermal limit.

In some example embodiments, the controller 180 may be an analog proportional-integral-derivative (PID) amplifier controller (e.g., controls operations based on a set-point or nominal value). In some other example embodiments, the controller 180 may be a hysteretic controller (e.g., controls operations based on an upper limit and a lower limit).

FIG. 5A is an example of a vertical dual-sided baseplate/cold-plate heatsink using a self-contained active water flow closed-loop system (e.g., with closed-loop outer flow, and using an internal expansion area and/or air or nitrogen compression head for liquid expansion with temperature) with a fan and pump cooling control loop. In other words, the example of FIG. 5A is similar to the example of FIG. 4B, but with the addition the external bellows and the pump in between the baseplate/cold-plate/heatsink and the external heat exchanger, and the controller being configured to control the pump in addition to the fan and the power source.

FIG. 5A may also be considered as depicting a fan-in latent-heat-of-vaporization cooling method with active heat pump and external heat exchanger heatsink with cooling control loop. The active water pump and air flow single-phase closed-loop water cooling method uses a local fan air and/or water pump and/or power source control loop to regulate removal of the additional heat above the stored heat energy to stay within the water mass latent heat vaporization range, for improved local cooling efficiency. This may be an example of an active electric liquid pump flow control loop. The vertical dual-sided baseplate/cold-plate/heatsink closed-loop single-phase cooling method uses a self-contained active water flow closed-loop system, within the 100° C. latent heat of vaporization area, with fan control and pump control. Single-phase controlled water to 100° C. maximum baseplate/cold-plate/heatsink temperature, with controlled temperature rise limit to 125° C. maximum junction temperature limit for worst-case stress and full-load derating with low air flow cooling power needed. Additional heat removal with thin-fin high-surface area heatsink strip assemblies (which may be added as applicable to the baseplate and power components). This example may use minimum fan and pump power to remove heat and store heat within the latent heat of vaporization operating range. This example may include additional control of the water pump power and the fan power to regulate the stored heat energy in the latent-heat-of-vaporization range for the water example at 100° C. This may also include an optional bellows for water heat expansion with a sensor.

Other sensors may include water temperature, water expansion, and internal pressure. A preferred sensing method for control may measure the portion of the stored heat energy in the latent-heat-of-vaporization range in the water mass for a maximum cal/gram limit. These sensing methods and the control algorithm may be determined during a pre-calibration process, for example. Internal pressure-to-thermal-energy or water expansion-to-thermal-energy may provide the best sensing methods, for example. A pressure sensor in the top of the baseplate/cold-plate/heatsink may indicate proper cooling operation and may be determined in a pre-calibration stage of development or production. A pressure transducer may be used to regulate the fan power and flow rate at limit to the maximum cal/gram water heat energy level. A maximum temperature may also be interlocked with the power to the heat source energy being cooled to turn off power if the heat energy is too high for the fans to cool, or if the latent heat cooling heatsink cooling loop is not working correctly.

A smart control loop for fan speed control and pump speed control may maintain the water latent heat storage within a controlled point or range of stored heat at 100° C. water temperature with a known difference (e.g., measured, calibrated, or controlled) between the 100° C. water and the heatsink temperature (with heatsink temperature sensing and/or water expansion sensing), to correlate to power heat energy in the water mass. A controller 180 (e.g., analog PID amplifier control loop or hysteretic control loop) may control the fan speed air flow and the pump speed water flow for heat removal to maintain the water mass within the 100° C. enthalpy of vaporization/evaporation (latent heat) range over high power load operating ranges with temperatures and differences (e.g., over the full-load power supply heat losses). Overtemperature and overpressure/expansion protection may be included to control the system power source.

In one non-limiting example embodiment, the fan air flow may provide ~20-30% forced-air cooling of power components, and the baseplate/cold-plate heatsink 110 (optionally in combination with the external heat exchanger 130) may provide 70-80% liquid/air cooling of power components, for improved cooling efficiency. However, various different ratios or percentages of the heat load energy stored in the liquid mass in the baseplate/cold-plate compared to the heat load energy to be removed to the air may be utilized.

Figure 5B:
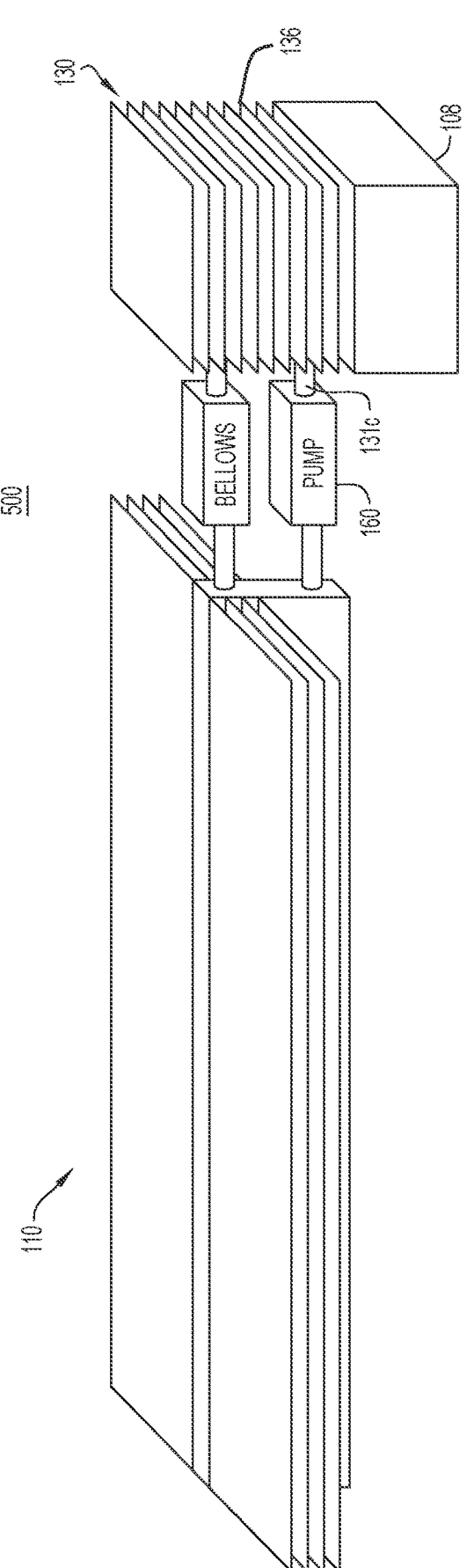
FIG. 5B is a diagram of the system of FIG. 5A, further including an output power connector attached to the external heat exchanger, according to an example embodiment.

FIG. 5B is a diagram of the system 500 of FIG. 5A, further including an output power connector 108 at a location inside a FEP supply unit below the external heat exchanger 130 in the fan air flow channel over the connector allowing the full air flow volume across the fins 136 of the external heat exchanger 130 for improved fan air cooling efficiency, according to an example embodiment. This may be a practical location for the external heat exchanger 130 in an area above the large connector area in the FEP supply unit that is typically unused and creates an air flow channel for the majority of the air flow volume. The air flow may be in the forward direction from input to output or the reverse direction from output to input, related to the input power at the front forward end and the output power at the back reverse end.

As shown in FIG. 5B, the external heat exchanger 130 may have an output power connector 108 mounted underneath, and may be configured to provide convection air cooling via the fins 136, for example. In some example embodiments, the addition of the output power connector 108 may result in some slight modifications to the external heat exchanger 130 (e.g., reduced height overall, less internal piping) and/or the lower pipe 131c (e.g., bent or curved) connecting the external heat exchanger 130 to the pump 160, which can be seen when comparing FIG. 5B to FIG. 5A. The output power connector 108 may similarly be incorporated into any of the previously described example embodiments including the external heat exchanger 130.

FIG. 5B may also be considered as depicting a vertical dual-sided baseplate/cold-plate/heatsink single-phase cooling method, with a self-contained active water flow closed-loop system with cooling control loop, within a front-end power supply (e.g., a 228 W dual-input FEP supply). This example provides a method for storing a portion of heat energy in the latent-heat-of-vaporization range for the example of a water mass boiling at 100° C., and cooling a FEP supply using the cooling control loop in the baseplate/cold-plate/heatsink and the external heat exchanger, with an active water pump. This may provide room for the pump, optional bellows, heat exchanger, and the output power connector for improved air cooling efficiency. The area above the output connector is normally empty for the air volume flow path. The heat exchanger may be placed in this area to maximize use of water-to-air cooling efficiency across the fin area, with minimal detrimental effects of added back pressure. This method with location of an output power connector 108 and the external heat exchanger 130 in FIG.

5B may also be incorporated in the examples of FIG. 4B and FIG. 5A for improved air flow efficiency in applicable FEP supply units.

Figure 6:
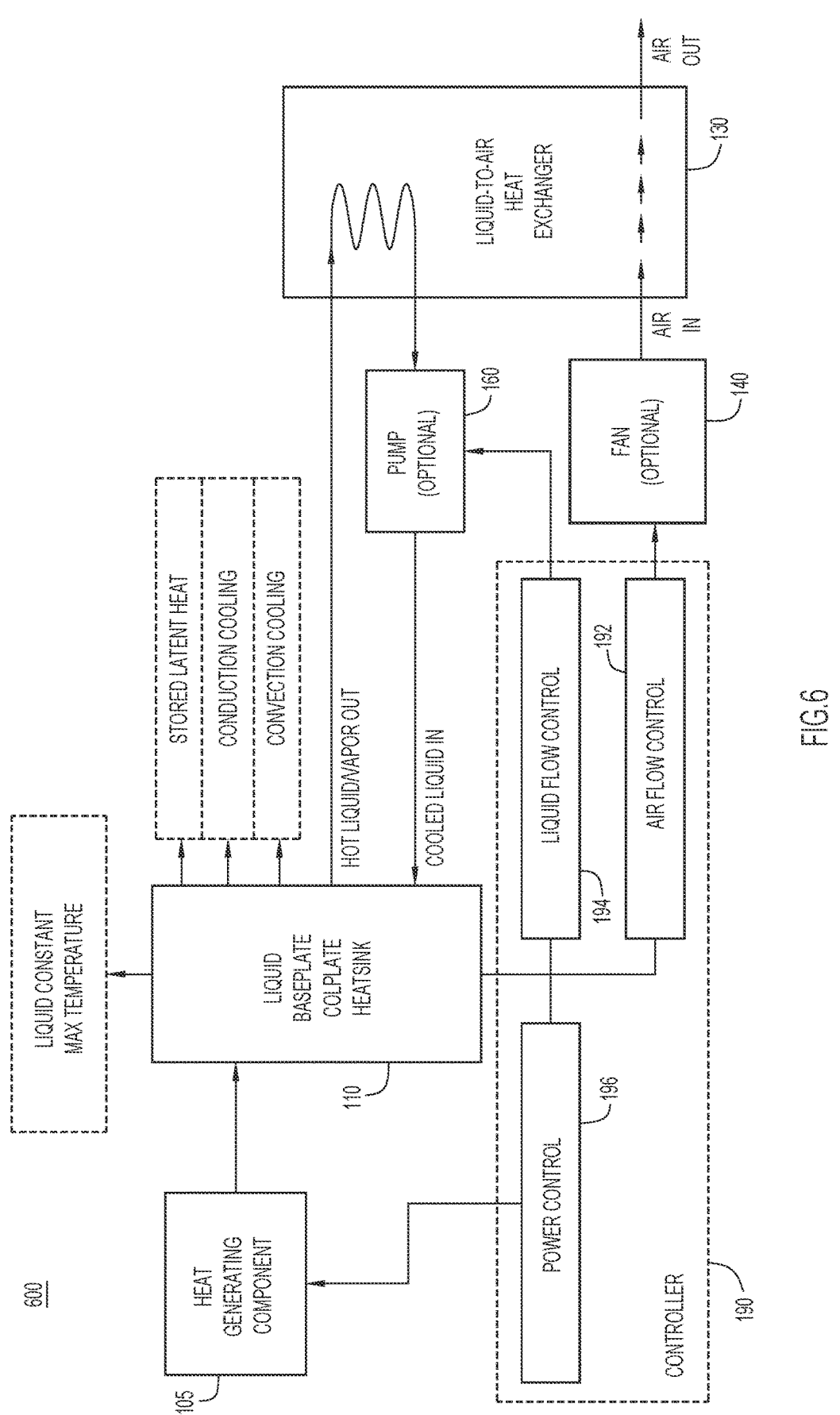
FIG. 6 is a functional block diagram of a thermal sensing and control system, including a baseplate/cold-plate heatsink, for regulation of a constant maximum temperature within the single-phase latent heat of vaporization range, according to an example embodiment.

FIG. 6 is a functional block diagram of a thermal sensing and control system 600, including a baseplate/cold-plate heatsink 110, for regulation of a constant maximum temperature within the single-phase latent heat of vaporization range, according to an example embodiment.

As stated, the general concept for a single-phase liquid-cooled baseplate/cold-plate/heatsink involves the use of liquid (as opposed to aluminum, for example) as the material-to-air heat exchanger. Control methods are employed to operate below and within the liquid latent heat limited range for heat storage and cooling at a constant and controlled temperature.

As shown in FIG. 6, the system 600 includes a power source 105 (e.g., one or more heat generating components 102 of FIG. 1), and a baseplate/cold-plate heatsink 110, as previously described. The baseplate/cold-plate heatsink 110 is configured to provide cooling in various manners, including "conduction cooling" (e.g., via the baseplate/cold-plate 112), "convection cooling" (e.g., via the fins 116), and "stored latent heat cooling" (e.g., via the liquid mass 118 contained within the baseplate/cold-plate 112). Preferably, the liquid mass 118 can be maintained at a constant maximum temperature according to the techniques described herein.

In addition, the system 600 may include an external heat exchanger 130, a fan 140 and a pump 160 (the fan and/or the pump may be optional according to different embodiments). Further, the system 600 may include a controller 190. The controller 190 may include an air flow control module 192 (controls the fan 140), a liquid flow control module 194 (controls the pump 160), and a power control module 196 (controls the power source 105). The controller 190 of FIG. 6 may correspond to the fan/power controller 150 of FIGS. 4A-4B and/or the fan/pump/power controller 180 of FIG. 5A, for example, depending on which of these components is included or omitted according to various different embodiments.

Hot liquid/vapor may be output from the baseplate/cold-plate heatsink 110 to the external heat exchanger 130, the hot liquid/vapor may be cooled to the air via the external heat exchanger 130, and cooled liquid may be input to the baseplate/cold-plate heatsink 110 from the external heat exchanger 130 via the pump 160. Cooler air may be output from the fan 140, causing hotter air to radiate out from any adjacent components. Although the fan 140 is shown next to the external heat exchanger 130 in the schematic diagram of FIG. 6, it is noted that the fan 140 may be physically located next to the baseplate/cold-plate heatsink 110 (as shown in FIGS. 4A-4B and 5A).

The fan 140 (optional) may not be needed with conduction cooling and/or convection air cooling only (e.g., refer to FIGS. 2A-2G and 3A-3B). The pump 160 (optional) may not be needed with passive heat pumping (e.g., refer to FIGS. 2A-2G, 3A-3B, and 4A-4B).

Figure 7A:
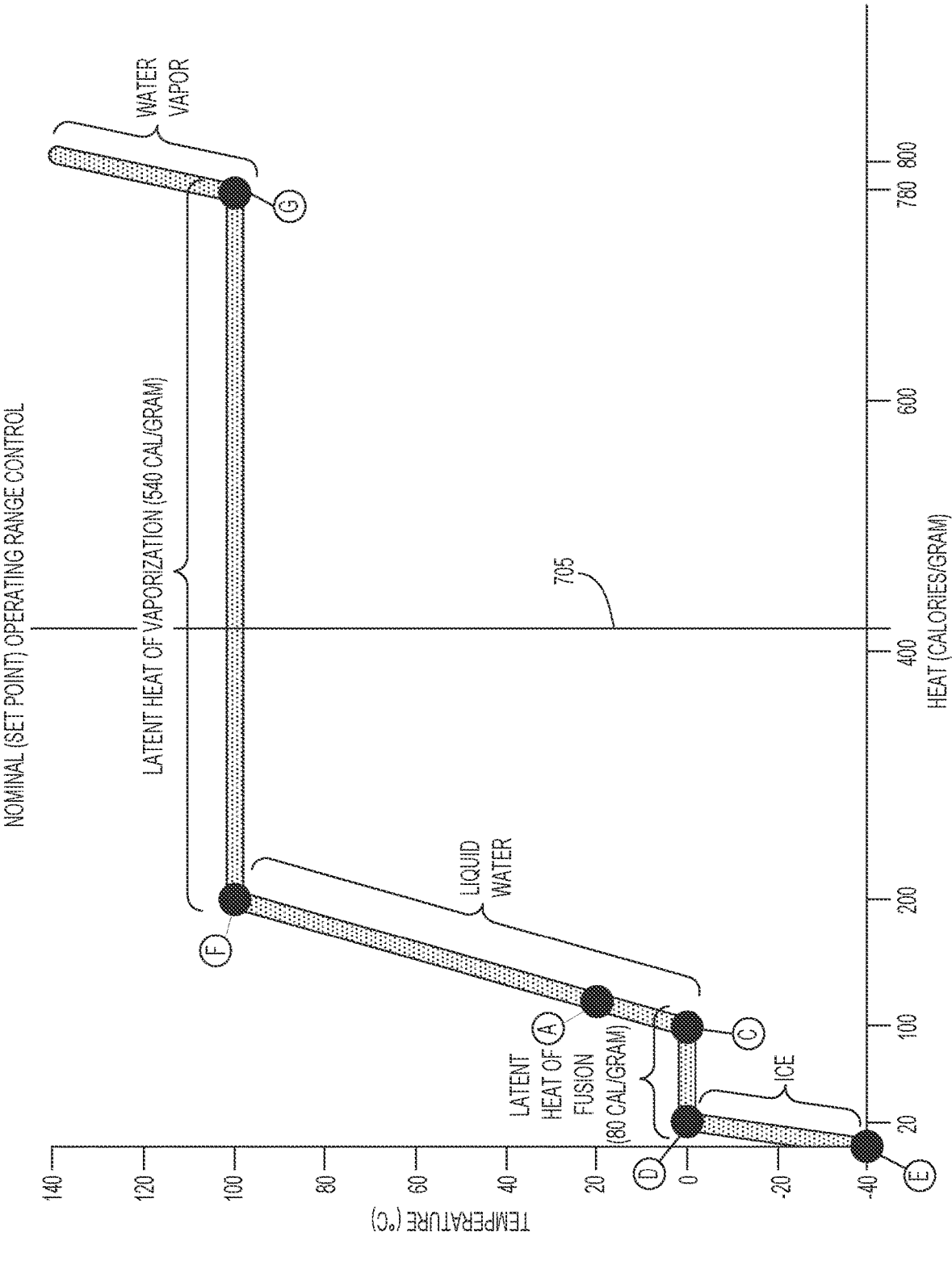
FIGS. 7A and 7B illustrate an example proportional-integral-derivative (PID) amplifier control method (using a defined set-point, with margin) to control the maximum temperature to stay in the latent-heat-of-vaporization region with a latent-heat-of-vaporization single-phase liquid cooling system, according to an example embodiment.
Figure 7B:
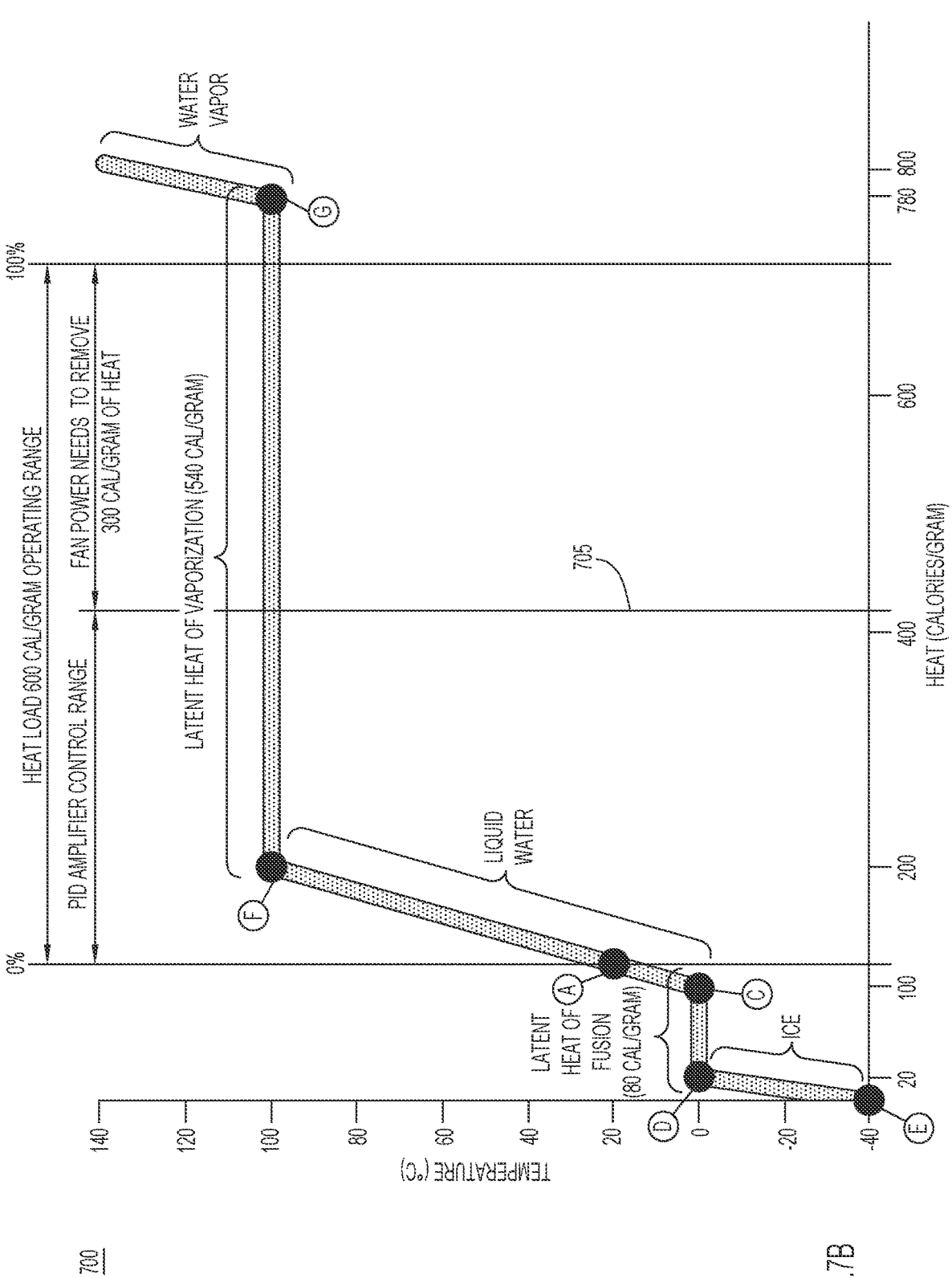

FIGS. 7A and 7B illustrate an example of a proportional-integral-derivative (PID) amplifier control method 700 (using a defined set-point, with margin) to control the maximum temperature to stay in the latent-heat-of-vaporization region with a latent-heat-of-vaporization single-phase liquid cooling system, according to an example embodiment.

FIG. 7A is an example illustrating the concept of regulating temperature (heat removal) in an analog PID amplifier control loop around the nominal area of the latent heat of vaporization region. Nominal operating range control refers to using the analog PID amplifier to control a maximum operating range or regulation point (e.g., set point 705) in the latent heat of vaporization range (within points "F" and "G", with margin). The vertical dual-sided baseplate/cold-plate/heatsink single-phase water cooling method example uses a PID amplifier control loop to regulate the water-stored heat energy in a nominal area of the latent heat of vaporization range at 100° C. This is an example of a single-phase liquid cooling PID control loop in the latent heat of vaporization range (inside the F and G limits, with margin). A fan control example may include or be replaced with a pump flow control example, where applicable.

This example involves storing part of the heat energy in the water, and regulating the fan/pump cooling for the remaining heat. Additional heat removal is possible with air/water cooling in a fan/pump control loop to maintain the water within the 100° C. enthalpy of vaporization/evaporation (latent heat) range during higher load power operating ranges. Some sensing control method examples may use water pressure, expansion, temperatures and/or temperature differences between water and heatsink for heat energy in water.

FIG. 7B shows a PID control loop control range with fan cooling control example of the zero to full load (0-100% load) heat energy in the water mass of 0-600 cal/gram within the latent heat of vaporization range from an ambient temperature of 25 C. As shown in FIG. 7B, when the liquid/water mass is hotter (above the set point 705) with load power above the set point 705, the controller will turn the fan on to regulate air cooling of the water. When the liquid/water mass is cooler (below the set point 705), the controller will turn the fan off with load power below the set point 705. This example requires 300 cal/gram of maximum heat removal from the water mass (e.g., via fan power) for a 600 cal/gram heat load operating range (i.e., the other ~300 cal/gram of water-stored heat energy requires no cooling). In contrast with 2-phase water cooling with heat-pipes (e.g., the heat pipes are used to vaporize to steam with >100° C. water temperatures, but then most or all of the heat energy that heated the water into vapor needs to be removed to condense back to a liquid into the air by fan power, and requiring 650 cal/gram of heat removal (e.g., via fan power) for a ~680 cal/gram heat load operating range), this example uses much less fan power (e.g., less than half, or about 50% energy savings) for heat removal and maintains 100° C. maximum water for higher cooling efficiency. Thus, the controller can use PID amplifier control to maintain the temperature of the liquid mass 118 in the baseplate/cold-plate 112 of the baseplate/cold-plate heatsink 110 to stay within the latent heat of vaporization range (e.g., at 100° C., in the example of using water for the liquid mass).

It is further noted that, in the example method 700 of FIGS. 7A-7B, the nominal operating range or regulation point (set point 705) may be dynamically adjustable (e.g., to set a higher or lower threshold, to increase or decrease the margin of error, or define a wider or narrower operating range) to adapt to different operating conditions and cooling requirements. The nominal control set point is a maximum of the stored heat energy in the water mass that can be set anywhere in the range between "F" (200 cal/gram) and "G" (740 cal/gram) and effects the amount of stored heat energy and the amount of cooling heat energy ratio, thereby effecting the cooling efficiency, but preferably there should be some margin below the vaporization/evaporation point G. Also, the 0-100% load heat energy may start at a higher ambient temperature and extend well beyond the 740 cal/ gram of the water mass shown in this example, therefore requiring more heat to be removed by the fan power air flow, for example.

Figure 7C:
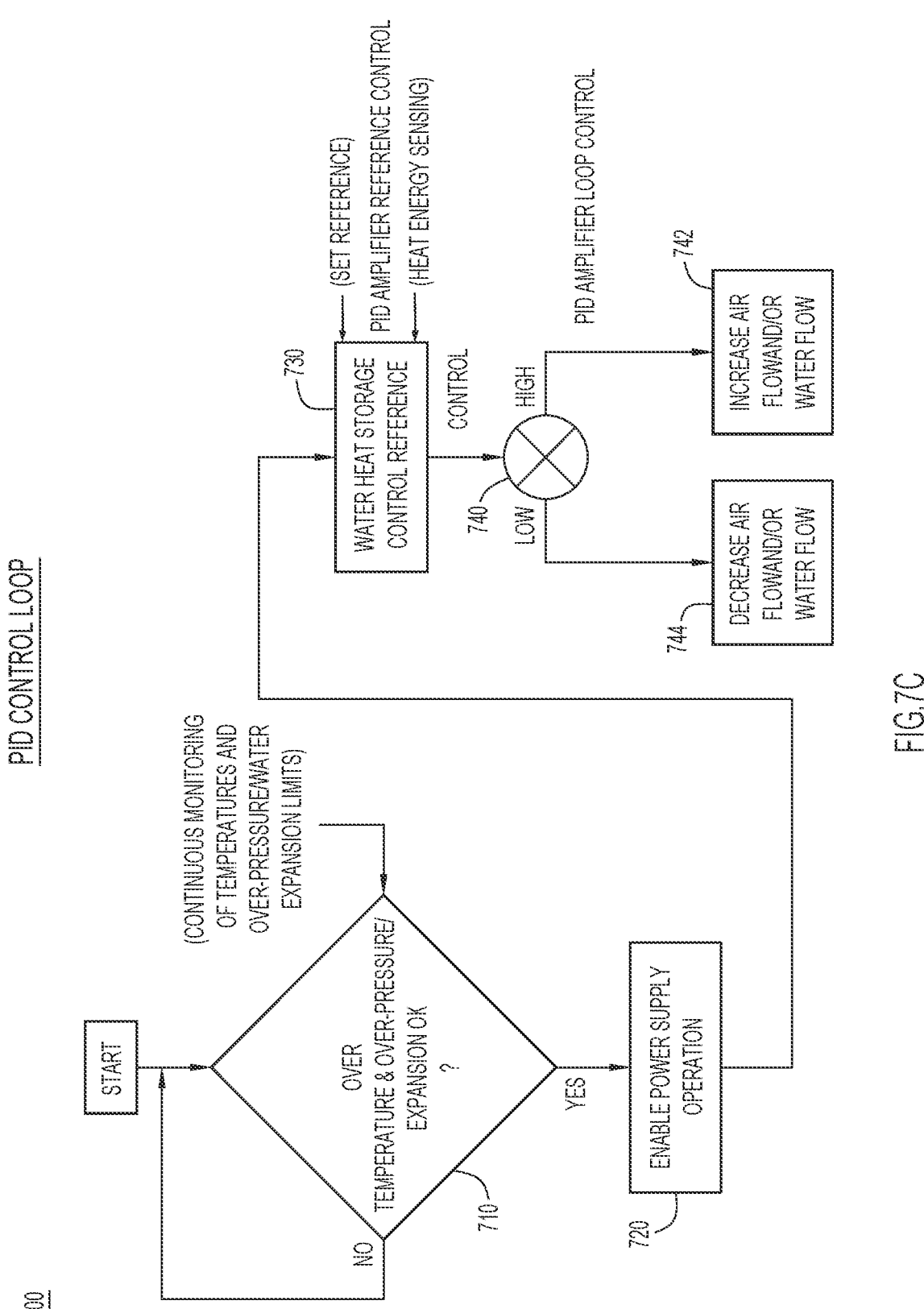
FIG. 7C is a flowchart illustrating a PID control loop of the method for controlling air flow and/or water flow, according to an example embodiment.

FIG. 7C is a flowchart illustrating a PID control loop of the method 700 of FIGS. 7A-7B for controlling air flow and/or water flow, according to an example embodiment. FIG. 7C is a basic water heat storage control flow diagram example of the baseplate/cold-plate/heatsink 1-phase water cooling design, with a PID amplifier control loop to regulate the water-stored heat energy in a nominal area of the latent heat of vaporization at 100° C. example. The method 700 may be implemented by the controller 190 of FIG. 6 (e.g., the fan/power controller 150 of FIGS. 4A-4B, or the fan/pump/power controller 180 of FIG. 5A), for example.

The controller may perform continuous monitoring of temperatures and over-pressure/water expansion limits. If the temperature limits and/or the over-pressure/water expansion limits are exceeded ("No" at decision 710), a power supply may remain disabled. If the temperature limits and the over-pressure/water expansion limits are not exceeded ("Yes" at decision 710), then power supply operation is enabled at step 720.

At step 730, a water heat storage control reference operation is performed to set a reference (set-point). PID amplifier reference control may determine the water heat storage control reference (set-point) through analysis of the liquid/water mass, temperatures, heat expansion, heatsink-to-water thermal resistance (possibly by calibration), and heat source power heat energy to be cooled from load power level and efficiency, for example.

At step 740, a PID amplifier loop control operation is performed to compare temperature/pressure/expansion differences to the reference for PID amplifier air flow control and/or water flow control, and adjust air flow and/or water flow accordingly. If above the reference ("High" at step 740), then an INCREASE air flow and/or water flow operation is performed, at step 742. If below the reference/set-point ("Low" at step 740), then a DECREASE air flow and/or water flow operation is performed, at step 744.

In addition, if the temperature limits or the over-pressure/water expansion limits are exceeded at any time during the PID amplifier reference control or the PID amplifier loop control, a disable power supply operation may be performed (not shown in FIG. 7C).

Figure 7D:
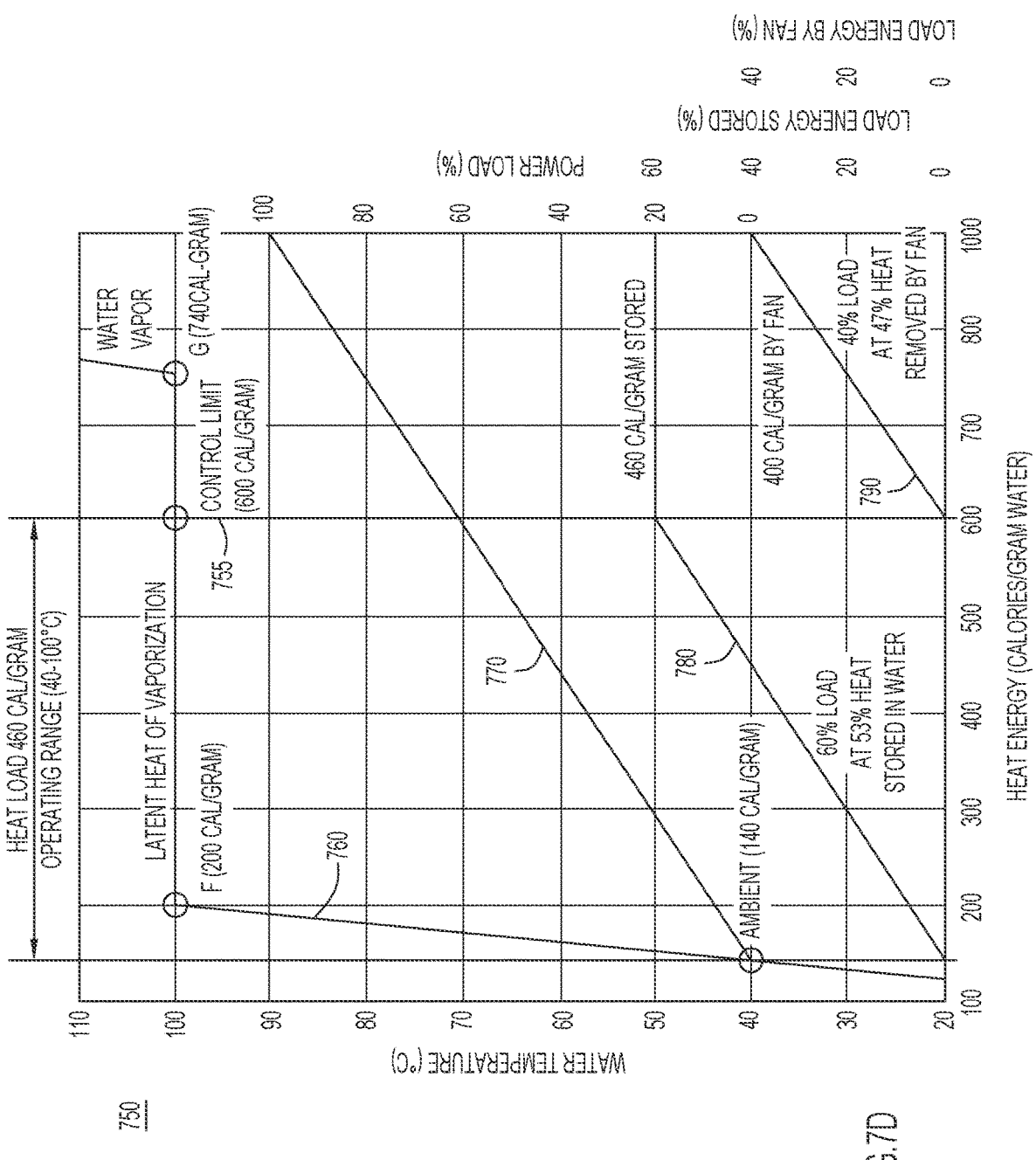
FIG. 7D is a graphical chart depicting an example PID amplifier control method, according to an example embodiment.

FIG. 7D is a graphical chart illustrating an example PID amplifier control method 750, according to an example embodiment.

FIG. 7D depicts a theoretical example of a baseplate/cold-plate/heatsink single-phase water cooling method that uses PID amplifier control of fan and/or pump control cooling to regulate the liquid/water mass heat energy in a narrow temperature range from ambient air temperature to the regulation point (control limit, or set-point) below the vaporization/evaporation point ("G"). This example uses a 60/40% load ratio of 53%/47% load-heat-stored/load-heat-cooling, operating in the latent-heat-of-vaporization region at 100° C. maximum, to provide increased air cooling capability.

FIG. 7D is an example of a fan-cooled PID control loop with latent-heat-of-vaporization cooling, showing the storage of heat energy load starting at an ambient temperature of 40° C. with 140 cal/gram heat energy in the water mass, and to the beginning of the 200 cal/gram stored heat energy at 100° C. water temperature in the latent-heat-of-vaporization range. FIG. 7D depicts a control limit 755 (set point) at 600 cal/gram heat energy, and several curve plots of the heat load energy control range including water temperature 760 (40-

100° C.) curve, power load 770 (0-100%) curve, load energy stored in water 780 (0-60%) curve, and load energy removed by fan 790 (0-40%) curve. As the heat energy continues to increase from 0-60% load, it is stored in the water mass to the 600 cal/gram heat energy level (460 cal/gram is the load heat energy stored in the water mass), without any need for fan power air cooling. The heat energy continues to increase to a maximum that would be equal to 1000 cal/gram of water mass, but the control limit 755 (set point) is 600 cal/gram maximum storage in this example, so the excess 400 cal/gram above the control limit 755 is removed by the fan power and air flow.

Figure 8A:
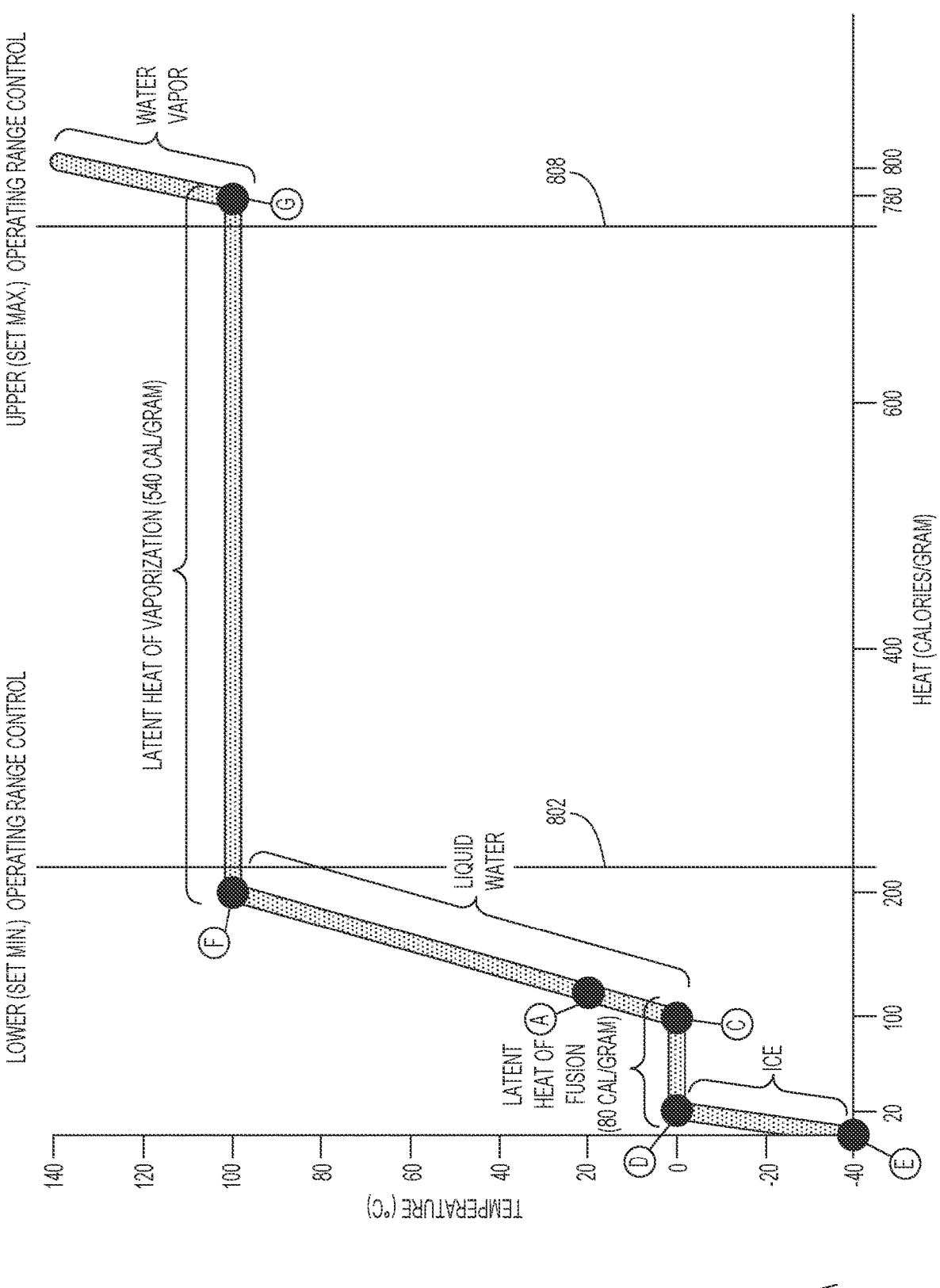
FIGS. 8A and 8B are charts depicting an example hysteretic control method (using a defined range between an upper limit/maximum and a lower limit/minimum, with margin) to control the maximum temperature to stay in the latent-heat-of-vaporization region with a latent-heat-of-vaporization single-phase liquid cooling system, according to an example embodiment.
Figure 8B:
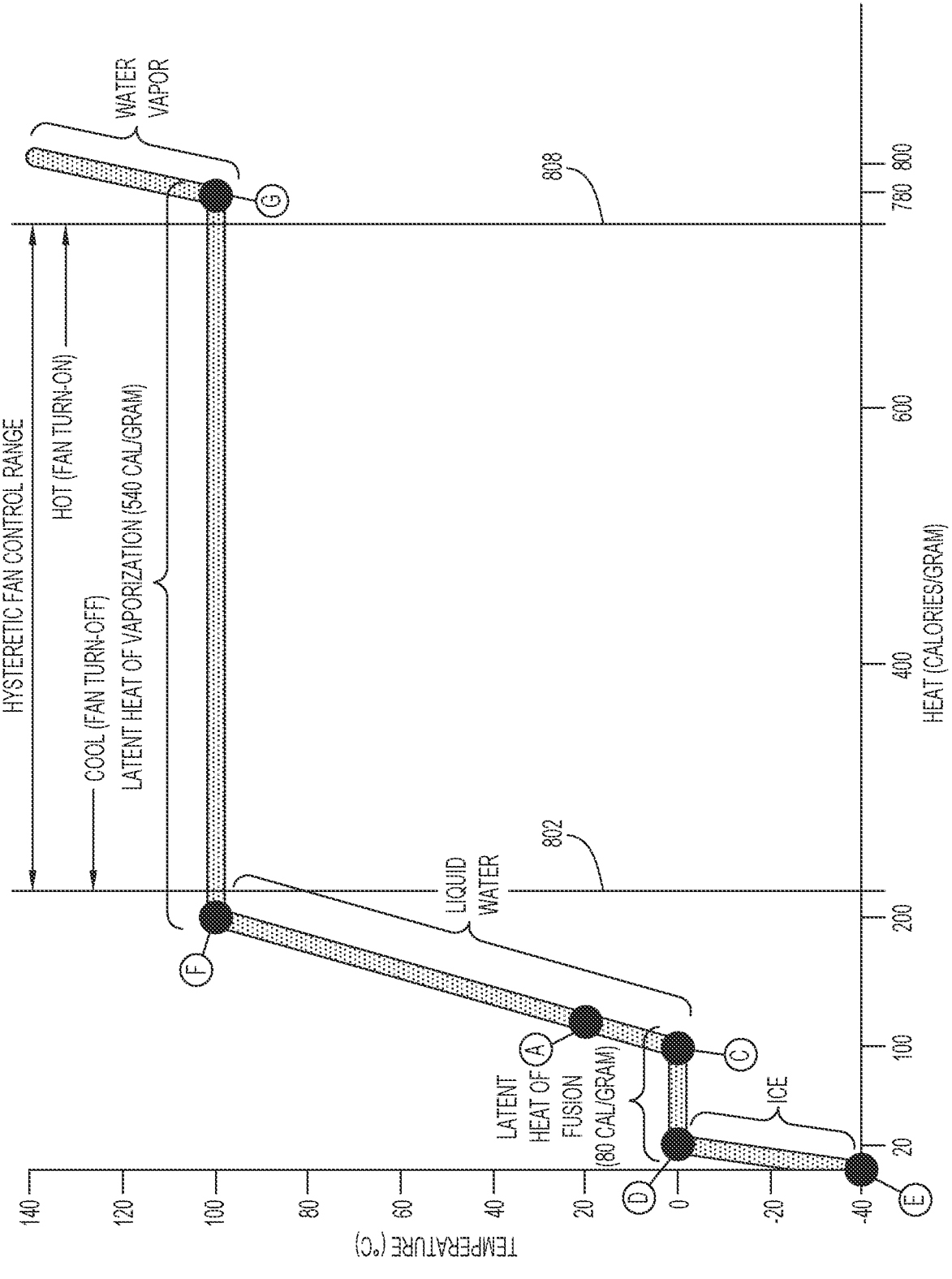

FIGS. 8A and 8B illustrate an example of a hysteretic control method 800 (using a defined range between an upper limit/maximum and a lower limit/minimum, with margin) to control the maximum temperature to stay in the latent-heat-of-vaporization region with a latent-heat-of-vaporization single-phase liquid cooling system, according to an example embodiment.

FIG. 8A depicts regulating temperature (heat removal) in a hysteretic control loop with fan cooling in a fixed temperature range (defined by a lower limit 802 (minimum) and an upper limit 808 (maximum)) within the latent heat of vaporization range (between or inside of the liquid condensing point "F" and the vaporization/evaporation point "G" limits, with margin). The vertical dual-sided baseplate/cold-plate with single-phase water cooling method example uses a hysteretic control loop to regulate the water-stored heat energy in a narrow/fixed temperature range area within the latent heat of vaporization range at 100° C., between the vaporization/evaporation point ("G") and the liquid condensing point ("F"). This is an example of single-phase liquid cooling hysteretic control loop in the latent heat of vaporization range (inside the F and G range limits, with margin). A fan control example may include or be replaced with a pump flow control example, where applicable.

As shown in FIG. 8B, the upper limit 808 and the lower limit 802 of cooling heat energy stored in the water are set inside the point F (200 cal/gram) and the point G (740 cal/gram). When the liquid/water mass is hotter (and the stored energy in the water mass reaches the upper limit 808, or maximum point), the controller will turn the fan power on to remove excess heat energy to the air. When the liquid/water mass is cooler (and the stored energy in the water mass reaches the lower limit 802, or minimum point), the controller will turn the fan power off. Thus, the controller can use hysteretic control to maintain the temperature of the liquid mass 118 in the baseplate/cold-plate 112 of the baseplate/cold-plate heatsink 110 to stay within the latent heat of vaporization range (e.g., at 100° C., in the example of using water for the liquid mass).

It is further noted that, in the example method 800 of FIGS. 8A-8B, the upper limit 808 (maximum) and the lower limit 802 (minimum) may be dynamically adjustable (e.g., to set a higher or lower threshold, to increase or decrease the margin of error, or to define a wider or narrower range) to adapt to different operating conditions and cooling requirements.

In addition, using a single-phase hysteretic control method allows a fixed 100° C. water temperature and allowance to store thermal energy in the water and only need to remove heat at higher heat/power loads to stay below the vaporization/evaporation point ("G"), thereby using less fan cooling power (as compared to a 2-phase hysteretic control method that requires above and below 100° C. water temperature and requires to vaporize above G on every cycle at any heat/power load and then cool all of the stored heat in the latent heat of vaporization past F, thereby needing high fan cooling power). In some examples, the hysteretic control range may be relatively narrow, so as to only remove a small amount of air per cycle.

Figure 8C:
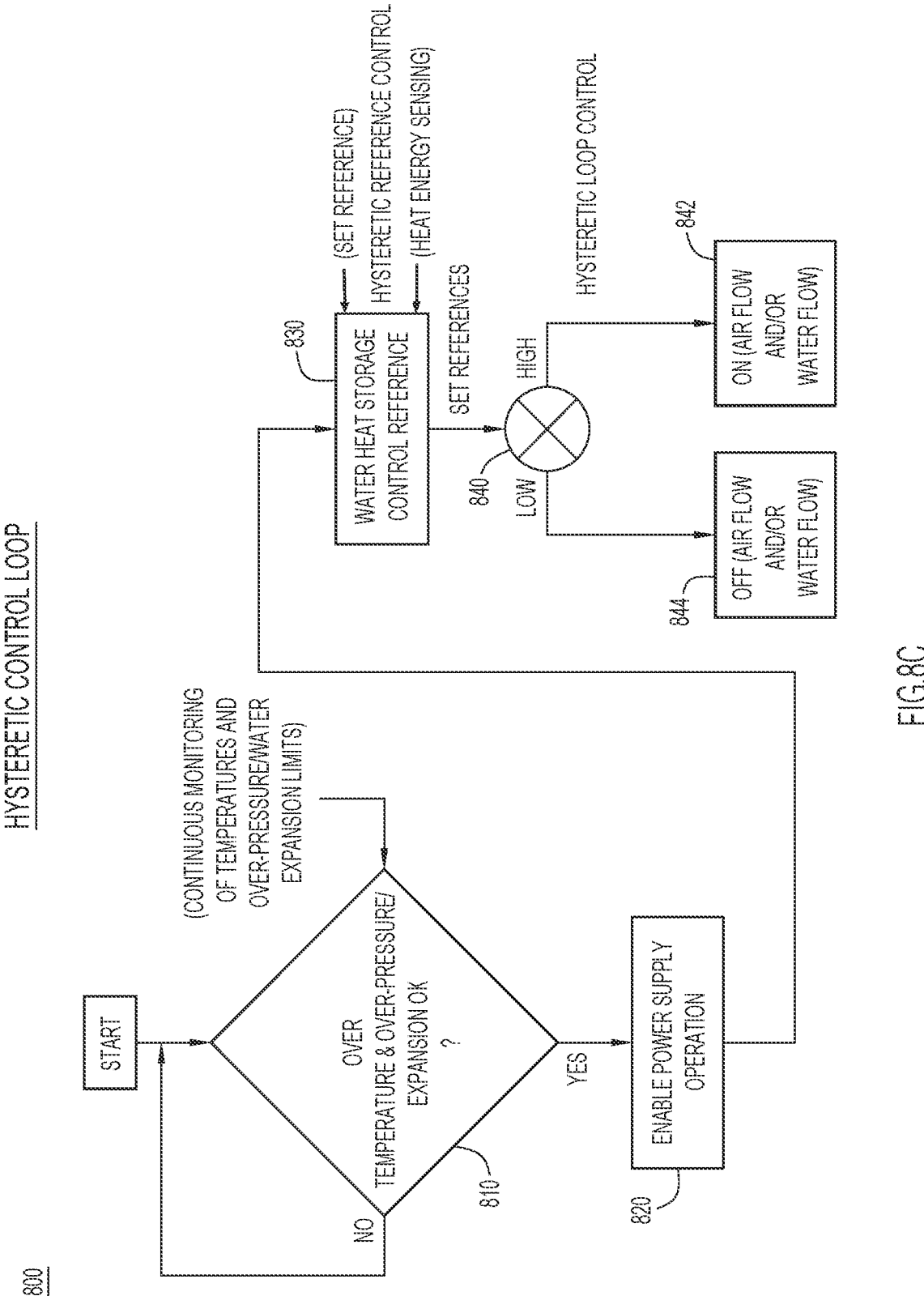
FIG. 8C is a flowchart illustrating a hysteretic control loop of the method for controlling air flow and/or water flow, according to an example embodiment.

FIG. 8C is a flowchart illustrating a hysteretic control loop of the method 800 of FIGS. 8A-8B for controlling air flow and/or water flow, according to an example embodiment. FIG. 8C is a basic water heat storage control flow diagram example of the baseplate/cold-plate/heatsink single-phase water cooling design, with a hysteretic control loop to regulate the water-stored heat energy in a fixed temperature range area in the latent heat of vaporization range between the vaporization/evaporation point ("G") and the liquid condensing point ("F"). The method may be implemented by the controller 190 of FIG. 6 (e.g., the fan/power controller 150 of FIGS. 4A-4B, or the fan/pump/power controller 180 of FIG. 5A), for example.

The controller may perform continuous monitoring of temperatures and over-pressure/water expansion limits. If the temperature limits and/or the over-pressure/water expansion limits are exceeded ("No" at decision 810), a power supply may remain disabled. If the temperature limits and the over-pressure/water expansion limits are not exceeded ("Yes" at decision 810), then power supply operation is enabled at step 820.

At step 830, a water heat storage control reference operation is performed to set references (upper limit or maximum, and lower limit or minimum). Hysteretic reference control may determine a high reference and a low reference through analysis of water temperatures, for example.

At step 840, a hysteretic loop control operation is performed to compare temperatures/pressures/expansion sensing proportional to the heat energy stored in the water to the high reference and/or the low reference (the upper limit/max. and/or the lower limit/min.) for hysteretic air flow control and/or water flow control, and adjust air flow and/or water flow accordingly. If the high reference (upper limit/max) has been reached ("High" at step 840), then a turn ON air flow and/or water flow operation is performed, at step 842. If the low reference (lower limit/min.) has been reached ("Low" at step 840), then a turn OFF air flow and/or water flow operation is performed, at step 844.

In addition, if the temperature limits or the over-pressure/water expansion limits are exceeded at any time during the hysteretic reference control or the hysteretic loop control, a disable power supply operation may be performed (not shown in FIG. 8C).

FIG. 8C is an example of a fan-cooled hysteretic control loop with latent-heat-of-vaporization cooling, with upper and lower limits set inside the point F (200 cal/gram) and G (740 cal/gram) within the latent-heat-of-vaporization region.

In summary, the described systems and methods regulate the latent heat of vaporization range for a maximum temperature (e.g., 100° C. in the water example), by storing some thermal energy in the water at 100° C., and only needing to cool the remaining thermal energy to the air, thereby improving air cooling efficiency and capability in higher power density power supplies. A central baseplate/cold-plate heatsink cooling design for the power components also provides improved cooling efficiency.

The components and techniques described above exploit the latent heat of vaporization in a single-phase water cooling example of a closed-loop system in a baseplate/cold-plate/heatsink at constant maximum temperature (e.g., 100° C. in the water example) over a very wide power dissipation of heat energy to be cooled range control system. Some of the heat is stored in the water, and as a result, less of the heat needs air cooling and fan power to maintain the component temperatures below a maximum operating limit. Together with a high efficiency heat exchanger with most of the air volume used, in conjunction with the described baseplate/cold-plate cooling advantages, much higher air cooling efficiency can be achieved compared to traditional methods that are typically used in conventional power supplies (e.g., FEP supplies).

Figure 9:
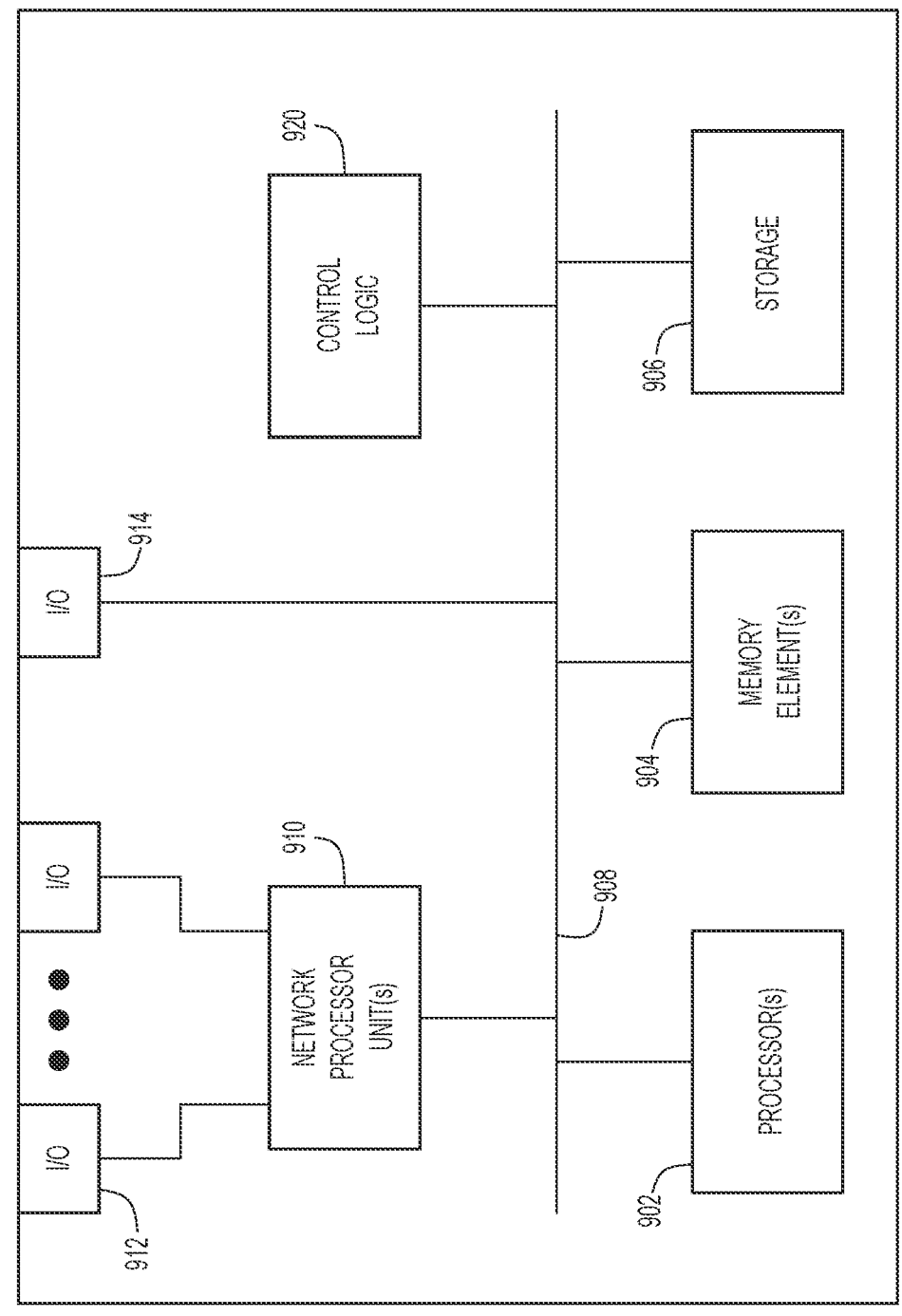
FIG. 9 depicts a hardware block diagram of a computing device that may perform functions associated with operations discussed herein in connection with the techniques depicted in FIGS. 4A, 4B, 5A, 6, 7A-7D, 8A and 8B.

Reference is now made to FIG. 9, which depicts a hardware block diagram of a computing device (or other device, e.g., networking device) 900 that may perform functions associated with operations discussed herein in connection with the techniques depicted in FIGS. 4A, 4B, 5A, 6, 7A-7D, 8A and 8B. In various embodiments, a computing device or apparatus, such as computing device 900 or any combination of computing devices 900, may be configured as any entity/entities as discussed for the techniques depicted in connection with FIGS. 4A, 4B, 5A, 6, 7A-7D, 8A and 8B, in order to perform operations of the various techniques discussed herein.

In at least one embodiment, the computing device 900 may be any apparatus that may include one or more processor(s) 902, one or more memory element(s) 904, storage 906, a bus 908, one or more network processor unit(s) 910 interconnected with one or more network input/output (I/O) interface(s) 912, one or more I/O interface(s) 914, and control logic 920. In various embodiments, instructions associated with logic for computing device 900 can overlap in any manner and are not limited to the specific allocation of instructions and/or operations described herein.

In at least one embodiment, processor(s) 902 is/are at least one hardware processor configured to execute various tasks, operations and/or functions for computing device 900 as described herein according to software and/or instructions configured for computing device 900. Processor(s) 902 (e.g., a hardware processor) can execute any type of instructions associated with data to achieve the operations detailed herein. In one example, processor(s) 902 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 904 and/or storage 906 is/are configured to store data, information, software, and/or instructions associated with computing device 900, and/or logic configured for memory element(s) 904 and/or storage 906. For example, any logic described herein (e.g., control logic 920) can, in various embodiments, be stored for computing device 900 using any combination of memory element(s) 904 and/or storage 906. Note that in some embodiments, storage 906 can be consolidated with memory element(s) 904 (or vice versa), or can overlap/exist in any other suitable manner.

In at least one embodiment, bus 908 can be configured as an interface that enables one or more elements of computing device 900 to communicate in order to exchange information and/or data. Bus 908 can be implemented with any architecture designed for passing control, data and/or information between processors, memory elements/storage, peripheral devices, and/or any other hardware and/or software components that may be configured for computing device 900. In at least one embodiment, bus 908 may be implemented as a fast kernel-hosted interconnect, potentially using shared memory between processes (e.g., logic), which can enable efficient communication paths between the processes.

In various embodiments, network processor unit(s) 910 may enable communication between computing device 900 and other systems, entities, etc., via network I/O interface(s) 912 (wired and/or wireless) to facilitate operations discussed for various embodiments described herein. In various embodiments, network processor unit(s) 910 can be configured as a combination of hardware and/or software, such as one or more Ethernet driver(s) and/or controller(s) or interface cards, Fibre Channel (e.g., optical) driver(s) and/or controller(s), wireless receivers/transmitters/transceivers, baseband processor(s)/modem(s), and/or other similar network interface driver(s) and/or controller(s) now known or hereafter developed to enable communications between computing device 900 and other systems, entities, etc. to facilitate operations for various embodiments described herein. In various embodiments, network I/O interface(s) 912 can be configured as one or more Ethernet port(s), Fibre Channel ports, any other I/O port(s), and/or antenna(s)/antenna array(s) now known or hereafter developed. Thus, the network processor unit(s) 910 and/or network I/O interface(s) 912 may include suitable interfaces for receiving, transmitting, and/or otherwise communicating data and/or information in a network environment.

I/O interface(s) 914 allow for input and output of data and/or information with other entities that may be connected to computing device 900. For example, I/O interface(s) 914 may provide a connection to external devices such as a keyboard, keypad, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 920 can include instructions that, when executed, cause processor(s) 902 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 920) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, any entity or apparatus as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 904 and/or storage 906 can store data, software, code, instructions (e.g., processor instructions), logic, parameters, combinations thereof, and/or the like used for operations described herein. This includes memory element(s) 904 and/or storage 906 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

In some aspects, the techniques described herein relate to a system including: a baseplate heatsink including an external housing configured to provide conduction cooling for one or more heat generating components in physical proximity to the baseplate heatsink, the external housing having a lower internal area configured to contain a liquid mass and an upper internal area configured to contain a gas, a first plurality of fins attached to one or both sides of the external housing adjacent to the upper internal area and configured to provide convection air cooling, one or more outlet ports adjacent to the upper internal area on a first end of the external housing, and an inlet port adjacent to the lower internal area on the first end of the external housing; and an external liquid-air heat exchanger including one or more inlet ports coupled with the one or more outlet ports of the baseplate heatsink, an expansion chamber coupled with the one or more inlet ports of the external liquid-air heat exchanger and configured to receive hot steam/vapor and/or hot liquid from the upper internal area of the baseplate heatsink, a second plurality of fins configured to provide convection air cooling, and an outlet port coupled with the expansion chamber and further coupled with the inlet port of the baseplate heatsink; and wherein the baseplate heatsink is configured to store, in the liquid mass, a first portion of heat energy of the one or more heat generating components up to a heat energy threshold within a latent heat of vaporization range below a vaporization point, and wherein the first plurality of fins of the baseplate heatsink and the second plurality of fins of the external liquid-air heat exchanger are configured to remove a second portion of heat energy of the one or more heat generating components above the heat energy threshold from the hot steam/vapor and/or hot liquid via convection air cooling, so as to return cooled liquid back to the lower internal area of the baseplate heatsink and thereby regulate an operating temperature of the liquid mass within the baseplate heatsink to stay within the latent heat of vaporization range for cooling the one or more heat generating components.

In some aspects, the techniques described herein relate to a system, wherein the first portion of heat energy to be stored in the liquid mass is greater than the second portion of heat energy to be removed via convection air cooling by the first plurality of fins of the baseplate heatsink and the second plurality of fins of the external liquid-air heat exchanger.

In some aspects, the techniques described herein relate to a system, wherein the external housing of the baseplate heatsink includes a mounting area for attachment to the one or more heat generating components, and for providing conduction cooling to an opposite side, a top, and/or a bottom of the baseplate heatsink.

In some aspects, the techniques described herein relate to a system, wherein the first plurality of fins of the baseplate heatsink include: a plurality of horizontal fins that are vertically stacked along an upper portion of one or both sides of the external housing of the baseplate heatsink above the mounting area; or a plurality of vertical fins that are horizontally stacked along the upper portion of one or both sides of the external housing of the baseplate heatsink above the mounting area.

In some aspects, the techniques described herein relate to a system, wherein the baseplate heatsink further includes a plurality of internal micro-channels extending between the lower internal area and the upper internal area, wherein the plurality of internal micro-channels are arranged such that cooled liquid enters the plurality of internal micro-channels via a lower end thereof and rises within the plurality of internal micro-channels with absorbing heat energy from the one or more heat generating components with increasing temperature and pressure within the external housing, and such that the hot steam/vapor and/or hot liquid enters the upper internal area of the baseplate heatsink via an upper end of the plurality of internal micro-channels as the liquid mass begins to boil.

In some aspects, the techniques described herein relate to a system including: a baseplate heatsink including an external housing configured to provide conduction cooling for one or more heat generating components positioned in physical proximity to the baseplate heatsink, the external housing having a lower internal area configured to contain a liquid mass and an upper internal area configured to contain a gas, and a plurality of fins attached to one or both sides of the external housing adjacent to the upper internal area and configured to provide convection air cooling; a fan adjacent to a second end of the external housing of the baseplate heatsink and configured to provide forced air cooling; a plurality of sensors arranged with respect to the baseplate heatsink; and a controller in communication with the fan and the plurality of sensors, wherein the controller is configured to obtain measurements from the plurality of sensors and control the fan based on the measurements, wherein the baseplate heatsink is configured to store, in the liquid mass, a first portion of heat energy of the one or more heat generating components up to a heat energy threshold within a latent heat of vaporization range below a vaporization point, and wherein the plurality of fins and the fan are configured to remove a second portion of heat energy of the one or more heat generating components above the heat energy threshold from hot steam/vapor and/or hot liquid in the upper internal area of the baseplate heatsink via convection air cooling and forced air cooling, so as to return cooled liquid back to the lower internal area of the baseplate heatsink and thereby regulate an operating temperature of the liquid mass within the baseplate heatsink to stay within the latent heat of vaporization range for cooling the one or more heat generating components.

In some aspects, the techniques described herein relate to a system, wherein the first portion of heat energy to be stored in the liquid mass is greater than the second portion of heat energy to be removed via convection air cooling by the plurality of fins of the baseplate heatsink and via forced air cooling by the fan.

In some aspects, the techniques described herein relate to a system, wherein the external housing of the baseplate heatsink includes a mounting area for attachment to the one or more heat generating components, and for providing conduction cooling to an opposite side, a top, and/or a bottom of the baseplate heatsink.

In some aspects, the techniques described herein relate to a system, wherein the plurality of fins of the baseplate heatsink include: a plurality of horizontal fins that are vertically stacked along an upper portion of one or both sides of the external housing of the baseplate heatsink above the mounting area; or a plurality of vertical fins that are horizontally stacked along the upper portion of one or both sides of the external housing of the baseplate heatsink above the mounting area.

In some aspects, the techniques described herein relate to a system, wherein the baseplate heatsink further includes a plurality of internal micro-channels extending between the lower internal area and the upper internal area, wherein the plurality of internal micro-channels are arranged such that cooled liquid enters the plurality of internal micro-channels via a lower end thereof and rises within the plurality of internal micro-channels with absorbing heat energy from the one or more heat generating components with increasing temperature and pressure within the external housing, and such that the hot steam/vapor and/or hot liquid enters the upper internal area of the baseplate heatsink via an upper end of the plurality of internal micro-channels as the liquid mass begins to boil.

In some aspects, the techniques described herein relate to a system, wherein the plurality of sensors are configured to measure one or more of baseplate heatsink temperature, fin temperature, internal pressure, water temperature, water expansion, and ambient air temperature, and the controller is configured to: analyze the measurements to estimate a heat energy level of the liquid mass within the baseplate heatsink; and control the fan to turn on for a variable period of time or turn off after the variable period of time according to a defined set-point heat energy level or a defined range of heat energy values between an upper limit and a lower limit, based on the heat energy level of the liquid mass.

In some aspects, the techniques described herein relate to a system including: a baseplate heatsink including an external housing configured to provide conduction cooling to one or more heat generating components in physical proximity to the baseplate heatsink, the external housing having an internal area configured to contain a liquid mass, a first plurality of fins attached to one or both sides of the external housing adjacent to an upper part of the internal area and configured to provide convection air cooling, an outlet port adjacent to the upper part of the internal area on a first end of the external housing, and an inlet port adjacent to a lower part of the internal area on the first end of the external housing; a bellows expansion chamber coupled to the outlet port of the baseplate heatsink, and configured to receive hot steam/vapor and/or hot liquid from the upper part of the internal area of the baseplate heatsink; a pump coupled to the inlet port of the baseplate heatsink; an external liquid-air heat exchanger including an inlet port coupled to the bellows expansion chamber, a second plurality of fins configured to provide convection air cooling, and an outlet port connected with the inlet port of the external liquid-air heat exchanger and further coupled to the pump; a plurality of sensors positioned with respect to the baseplate heatsink to obtain measurements; a fan adjacent to a second end of the external housing of the baseplate heatsink and configured to provide forced air cooling; and a controller in communication with the fan, the pump, and the plurality of sensors, wherein the controller is configured to obtain the measurements from the plurality of sensors and control the fan, the pump, or both the fan and the pump based on the measurements, wherein the baseplate heatsink is configured to store, in the liquid mass, a first portion of heat energy of one or more heat generating components up to a heat energy threshold within a latent heat of vaporization range below a vaporization point, and wherein the first plurality of fins of the baseplate heatsink, the second plurality of fins of the external liquid-air heat exchanger, the pump, and the fan are configured to remove a second portion of heat energy of the one or more heat generating components above the heat energy threshold from the hot steam/vapor and/or hot liquid via convection air cooling and forced air cooling, so as to return cooled liquid back to the lower part of the internal area of the baseplate heatsink and thereby regulate an operating temperature of the liquid mass within the baseplate heatsink to stay within the latent heat of vaporization range for cooling the one or more heat generating components.

In some aspects, the techniques described herein relate to a system, wherein the first portion of heat energy to be stored in the liquid mass is greater than the second portion of heat energy to be removed via convection air cooling by the first plurality of fins of the baseplate heatsink, the second plurality of fins of the external liquid-air heat exchanger, and the pump, and via forced air cooling by the fan.

In some aspects, the techniques described herein relate to a system, wherein the external housing of the baseplate heatsink includes a mounting area for attachment to the one or more heat generating components, and for providing conduction cooling to an opposite side, a top, and/or a bottom of the baseplate heatsink.

In some aspects, the techniques described herein relate to a system, wherein the first plurality of fins of the baseplate heatsink include: a plurality of horizontal fins that are vertically stacked along an upper portion of one or both sides of the external housing of the baseplate heatsink above the mounting area; or a plurality of vertical fins that are horizontally stacked along the upper portion of one or both sides of the external housing of the baseplate heatsink above the mounting area.

In some aspects, the techniques described herein relate to a system, wherein the baseplate heatsink further includes a plurality of internal micro-channels extending between the lower part of the internal area and the upper part of the internal area, wherein the plurality of internal micro-channels are arranged such that cooled liquid enters the plurality of internal micro-channels via a lower end thereof and rises within the plurality of internal micro-channels absorbing heat energy from the one or more heat generating components with increasing temperature and pressure within the external housing of the baseplate heatsink, and such that the hot steam/vapor and/or hot liquid enters the upper part of the internal area of the baseplate heatsink via an upper end of the plurality of internal micro-channels as the liquid mass begins to boil.

In some aspects, the techniques described herein relate to a system, wherein the plurality of sensors are configured to measure baseplate heatsink temperature, fin temperature, internal pressure, water temperature, water expansion, and ambient air temperature, and the controller is configured to: analyze the measurements to estimate a heat energy level of the liquid mass within the baseplate heatsink; and control the fan, the pump, or both the fan and the pump to turn on for a variable period of time or turn off after a variable period of time, according to a defined set-point heat energy level or a defined range of heat energy values between an upper limit and a lower limit, based on the heat energy level of the liquid mass.

In some aspects, the techniques described herein relate to a method including: storing, in a liquid mass in an internal lower area within an external housing of a baseplate heatsink, a first portion of heat energy of one or more heat generating components up to a heat energy threshold within a latent heat of vaporization range below a vaporization point; and removing excess heat energy of the one or more heat generating components above the heat energy threshold from hot steam/vapor and/or hot liquid in an internal upper area within the external housing of the baseplate heatsink via one or more air cooling components, so as to return cooled liquid back to the internal lower area of the baseplate heatsink and thereby regulate an operating temperature of the liquid mass within the baseplate heatsink to stay within the latent heat of vaporization range for cooling the one or more heat generating components.

In some aspects, the techniques described herein relate to a method, wherein removing the excess heat energy of the one or more heat generating components above the heat energy threshold via the one or more air cooling components includes one or more of: providing air convection cooling to remove the excess heat energy via a first plurality of fins attached to one or both sides of the external housing adjacent to the internal upper area of the baseplate heatsink; providing air convection cooling to remove the excess heat energy via a second plurality of fins of an external liquid-air heat exchanger, wherein the external liquid-air heat exchanger is coupled to the internal upper area of the baseplate heatsink to receive hot steam/vapor or hot liquid therefrom, and is further coupled to the internal lower area of the baseplate heatsink to return cooled liquid thereto; and controlling, via a controller, a fan adjacent to the baseplate heatsink to provide forced air cooling to remove the excess heat energy based on measurements obtained from a plurality of sensors with respect to the baseplate heatsink, so as to maintain the operating temperature of the liquid mass of the baseplate heatsink within the latent heat of vaporization range.

In some aspects, the techniques described herein relate to a method, wherein removing the excess heat energy of the one or more heat generating components above the heat energy threshold via the one or more air cooling components further includes: controlling, via the controller based on the measurements obtained from the plurality of sensors, a pump coupled to the external liquid-air heat exchanger and the baseplate heatsink, such that that the external liquid-air heat exchanger receives the hot steam/vapor and/or hot liquid from the internal upper area of the baseplate heatsink, removes the excess heat energy via the second plurality of fins, and returns the cooled liquid back to the internal lower area of the baseplate heatsink, so as to maintain the operating temperature of the liquid mass of the baseplate heatsink within the latent heat of vaporization range.

In some aspects, the techniques described herein relate to an apparatus including: a baseplate/cold-plate including an external housing configured to provide conduction cooling for one or more heat generating components positioned in physical proximity to the baseplate/cold-plate, the external housing having a lower internal area configured to contain a liquid mass and an upper internal area configured to contain a gas; and a plurality of fins attached to one or both sides of the external housing of the baseplate/cold-plate adjacent to the upper internal area and configured to provide convection air cooling, wherein the baseplate/cold-plate is configured to store, in the liquid mass, a first portion of heat energy of the one or more heat generating components up to a heat energy threshold within a latent heat of vaporization range below a vaporization point, and wherein the plurality of fins are configured to remove a second portion of heat energy of the one or more heat generating components above the heat energy threshold from hot steam/vapor and/or hot liquid in the upper internal area of the baseplate heatsink via convection air cooling, so as to return cooled liquid back to the lower internal area of the baseplate heatsink and thereby regulate an operating temperature of the liquid mass within the baseplate heatsink to stay within the latent heat of vaporization range for cooling the one or more heat generating components.

In some aspects, the techniques described herein relate to an apparatus, wherein the baseplate/cold-plate further includes a plurality of internal micro-channels extending between the lower internal area and the upper internal area, wherein the plurality of internal micro-channels are arranged such that cooled liquid enters the plurality of internal micro-channels via a lower end thereof and rises within the plurality of internal micro-channels with absorbing heat energy from the one or more heat generating components with increasing temperature and pressure within the external housing, and such that the hot steam/vapor and/or hot liquid enters the upper internal area of the baseplate heatsink via an upper end of the plurality of internal micro-channels as the liquid mass begins to boil.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the'(s)' nomenclature (e.g., one or more element(s)).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A system comprising:
   a baseplate heatsink configured to provide conduction cooling for one or more heat generating components in physical proximity to the baseplate heatsink, the baseplate heatsink having a lower interior part configured to contain a liquid mass and an upper interior part configured to contain a gas, a first plurality of fins attached to both sides of the baseplate heatsink and extending from the upper interior part in opposite directions and configured to provide convection air cooling, one or more outlet ports of the baseplate heatsink connected to the upper interior part on a first end of the baseplate heatsink, and an inlet port of the baseplate heatsink connected to the lower interior part on the first end of the baseplate heatsink; and an external heat exchanger including one or more inlet ports coupled with the one or more outlet ports of the baseplate heatsink, an internal expansion chamber coupled with the one or more inlet ports of the external heat exchanger and configured to receive hot steam/ vapor and/or hot liquid from the upper interior part of the baseplate heatsink, a second plurality of fins configured to provide convection air cooling, and an outlet port coupled with the internal expansion chamber and further coupled with the inlet port of the baseplate heatsink, wherein the baseplate heatsink is configured to store, in the liquid mass, a first portion of heat energy of the one or more heat generating components up to a heat energy threshold within a latent heat of vaporization range below a vaporization point, and wherein the first plurality of fins of the baseplate heatsink and the second plurality of fins of the external heat exchanger are configured to remove a second portion of heat energy of the one or more heat generating components above the heat energy threshold from the hot steam/vapor and/or hot liquid via convection air cooling, so as to return cooled liquid back to the lower interior part of the baseplate heatsink and thereby regulate an operating temperature of the liquid mass within the baseplate heatsink to stay within the latent heat of vaporization range for cooling the one or more heat generating components.

2. The system of claim 1, wherein the first portion of heat energy to be stored in the liquid mass is greater than the second portion of heat energy to be removed via convection air cooling by the first plurality of fins of the baseplate heatsink and the second plurality of fins of the external heat exchanger.

3. The system of claim 1, wherein the baseplate heatsink comprises a mounting area for attachment to the one or more heat generating components, and for providing conduction cooling to an opposite side, a top, and/or a bottom of the baseplate heatsink.

4. The system of claim 3, wherein the first plurality of fins of the baseplate heatsink comprise:

a plurality of horizontal fins that are vertically stacked and extending from an upper portion of both sides of the baseplate heatsink above the mounting area; or a plurality of vertical fins that are horizontally stacked along the upper portion of both sides of the baseplate heatsink above the mounting area.

5. The system of claim 1, wherein the baseplate heatsink further includes a plurality of internal micro-channels extending between the lower interior part and the upper interior part, wherein the plurality of internal micro-channels are arranged such that cooled liquid enters the plurality of internal micro-channels via a lower end thereof and rises within the plurality of internal micro-channels with absorbing heat energy from the one or more heat generating components with increasing temperature and pressure within the baseplate heatsink, and such that the hot steam/vapor and/or hot liquid enters the upper interior part of the baseplate heatsink via an upper end of the plurality of internal micro-channels as the liquid mass begins to boil.

6. A system comprising:

a baseplate heatsink configured to provide conduction cooling for one or more heat generating components positioned in physical proximity to the baseplate heatsink, the baseplate heatsink having a lower interior part configured to contain a liquid mass and an upper interior part configured to contain a gas, and a plurality of fins attached to both sides of the baseplate heatsink extending from the upper interior part in opposite directions and configured to provide convection air cooling;

a fan facing to a second end of the baseplate heatsink and configured to provide forced air cooling;

a plurality of sensors arranged with respect to the baseplate heatsink and configured to obtain measurements including a baseplate heatsink temperature, a fin temperature, an internal pressure, a water temperature, a water expansion, and an ambient air temperature; and a controller in communication with the fan and the plurality of sensors, wherein the controller is configured to obtain measurements from the plurality of sensors, analyze the measurements to estimate a heat energy level of the liquid mass within the baseplate heatsink and control the fan based on the measurements, wherein the baseplate heatsink is configured to store, in the liquid mass, a first portion of heat energy of the one or more heat generating components up to a heat energy threshold within a latent heat of vaporization range below a vaporization point, and wherein the plurality of fins and the fan are configured to remove a second portion of heat energy of the one or more heat generating components above the heat energy threshold from hot steam/vapor and/or hot liquid in the upper interior part of the baseplate heatsink via convection air cooling and forced air cooling, so as to return cooled liquid back to the lower interior part of the baseplate heatsink and thereby regulate an operating temperature of the liquid mass within the baseplate heatsink to stay within the latent heat of vaporization range for cooling the one or more heat generating components.

7. The system of claim 6, wherein the first portion of heat energy to be stored in the liquid mass is greater than the second portion of heat energy to be removed via convection air cooling by the plurality of fins of the baseplate heatsink and via forced air cooling by the fan.

8. The system of claim 6, wherein the baseplate heatsink comprises a mounting area for attachment to the one or more heat generating components, and for providing conduction cooling to an opposite side, a top, and/or a bottom of the baseplate heatsink.

9. The system of claim 8, wherein the plurality of fins of the baseplate heatsink comprise:

a plurality of horizontal fins that are vertically stacked along an upper portion of both sides of the baseplate heatsink above the mounting area; or a plurality of vertical fins that are horizontally stacked along the upper portion of both sides of the baseplate heatsink above the mounting area.

10. The system of claim 6, wherein the baseplate heatsink further includes a plurality of internal micro-channels extending between the lower interior part and the upper interior part, wherein the plurality of internal micro-channels are arranged such that cooled liquid enters the plurality of internal micro-channels via a lower end thereof and rises within the plurality of internal micro-channels with absorbing heat energy from the one or more heat generating components with increasing temperature and pressure within the baseplate heatsink, and such that the hot steam/vapor and/or hot liquid enters the upper interior part of the baseplate heatsink via an upper end of the plurality of internal micro-channels as the liquid mass begins to boil.

11. The system of claim 6, wherein the controller is configured to:

control the fan to turn on for a variable period of time or turn off after the variable period of time according to a defined set-point heat energy level or a defined range of heat energy values between an upper limit and a lower limit, based on the heat energy level of the liquid mass.

12. A system comprising:

a baseplate heatsink configured to provide conduction cooling to one or more heat generating components in physical proximity to the baseplate heatsink, the baseplate heatsink having a lower interior part configured to contain a liquid mass, a first plurality of fins attached to both sides of the baseplate heatsink and extending from an upper interior part in opposite directions and configured to provide convection air cooling, an outlet port of the baseplate heatsink connected to the upper interior part on a first end of the baseplate heatsink, and an inlet port connected to the lower interior part on the first end of the baseplate heatsink;

a bellows expansion chamber coupled to the outlet port of the baseplate heatsink, and configured to receive hot steam/vapor and/or hot liquid from the upper interior part of the baseplate heatsink;

a pump coupled to the inlet port of the baseplate heatsink;

an external heat exchanger including an inlet port coupled to the bellows expansion chamber, a second plurality of fins configured to provide convection air cooling, and an outlet port connected with the inlet port of the external heat exchanger and further coupled to the pump;

a plurality of sensors positioned with respect to the baseplate heatsink to obtain measurements including a baseplate heatsink temperature, a fin temperature, an internal pressure, a water temperature, a water expansion, and an ambient air temperature;

a fan facing to a second end of the baseplate heatsink and configured to provide forced air cooling; and a controller in communication with the fan, the pump, and the plurality of sensors, wherein the controller is configured to obtain the measurements from the plurality of sensors, analyze the measurements to estimate a heat energy level of the liquid mass within the baseplate heatsink and control the fan, the pump, or both the fan and the pump based on the measurements, wherein the baseplate heatsink is configured to store, in the liquid mass, a first portion of heat energy of one or more heat generating components up to a heat energy threshold within a latent heat of vaporization range below a vaporization point, and wherein the first plurality of fins of the baseplate heatsink, the second plurality of fins of the external heat exchanger, the pump, and the fan are configured to remove a second portion of heat energy of the one or more heat generating components above the heat energy threshold from the hot steam/vapor and/or hot liquid via convection air cooling and forced air cooling, so as to return cooled liquid back to the lower interior part of the baseplate heatsink and thereby regulate an operating temperature of the liquid mass within the baseplate heatsink to stay within the latent heat of vaporization range for cooling the one or more heat generating components.

13. The system of claim 12, wherein the first portion of heat energy to be stored in the liquid mass is greater than the second portion of heat energy to be removed via convection air cooling by the first plurality of fins of the baseplate heatsink, the second plurality of fins of the external heat exchanger, and the pump, and via forced air cooling by the fan.

14. The system of claim 12, wherein the baseplate heatsink comprises a mounting area for attachment to the one or more heat generating components, and for providing conduction cooling to an opposite side, a top, and/or a bottom of the baseplate heatsink.

15. The system of claim 14, wherein the first plurality of fins of the baseplate heatsink comprise:

a plurality of horizontal fins that are vertically stacked along an upper portion of both sides of the baseplate heatsink above the mounting area; or a plurality of vertical fins that are horizontally stacked along the upper portion of both sides of the baseplate heatsink above the mounting area.

16. The system of claim 12, wherein the baseplate heatsink further includes a plurality of internal micro-channels extending between the lower part of the interior part and the upper interior part, wherein the plurality of internal micro-channels are arranged such that cooled liquid enters the plurality of internal micro-channels via a lower end thereof and rises within the plurality of internal micro-channels absorbing heat energy from the one or more heat generating components with increasing temperature and pressure within the baseplate heatsink, and such that the hot steam/vapor and/or hot liquid enters the upper interior part of the baseplate heatsink via an upper end of the plurality of internal micro-channels as the liquid mass begins to boil.

17. The system of claim 12, wherein the controller is configured to:

control the fan, the pump, or both the fan and the pump to turn on for a variable period of time or turn off after a variable period of time, according to a defined set-point heat energy level or a defined range of heat energy values between an upper limit and a lower limit, based on the heat energy level of the liquid mass.

18. A method comprising:

storing, in a liquid mass in an lower interior part within a baseplate heatsink, a first portion of heat energy of one or more heat generating components up to a heat energy threshold within a latent heat of vaporization range below a vaporization point; and removing excess heat energy of the one or more heat generating components above the heat energy threshold from hot steam/vapor and/or hot liquid in an upper interior part within the baseplate heatsink via one or more air cooling components, so as to return cooled liquid back to the lower interior part of the baseplate heatsink and thereby regulate an operating temperature of the liquid mass within the baseplate heatsink to stay within the latent heat of vaporization range for cooling the one or more heat generating components, wherein removing the excess heat energy comprises providing air convection cooling via a first plurality of fins attached to both sides of the baseplate heatsink and extending from the upper interior part of the baseplate heatsink, and providing air convection cooling via a second plurality of fins of an external heat exchanger coupled to the upper interior part of the baseplate heatsink to receive hot steam/vapor or hot liquid therefrom coupled to the lower interior part of the baseplate heatsink to return cooled liquid thereto.

19. The method according to claim 18, further comprising:

controlling, via a controller, a fan facing the baseplate heatsink to provide forced air cooling to remove the excess heat energy based on measurements obtained from a plurality of sensors with respect to the baseplate heatsink, so as to maintain the operating temperature of the liquid mass of the baseplate heatsink within the latent heat of vaporization range.

20. The method according to claim 19, wherein removing the excess heat energy of the one or more heat generating components above the heat energy threshold via the one or more air cooling components further comprises:

controlling, via the controller based on the measurements obtained from the plurality of sensors, a pump coupled to the external heat exchanger and the baseplate heatsink, such that that the external heat exchanger receives the hot steam/vapor and/or hot liquid from the upper interior part of the baseplate heatsink, removes the excess heat energy via the second plurality of fins, and returns the cooled liquid back to the lower interior part of the baseplate heatsink, so as to maintain the operating temperature of the liquid mass of the baseplate heatsink within the latent heat of vaporization range.

\* \* \* \* \*